United States Patent
Paiella et al.

(10) Patent No.: US 11,257,856 B2
(45) Date of Patent: Feb. 22, 2022

(54) LENS-FREE COMPOUND EYE CAMERAS BASED ON ANGLE-SENSITIVE META-SURFACES

(71) Applicant: TRUSTEES OF BOSTON UNIVERSITY, Boston, MA (US)

(72) Inventors: Roberto Paiella, Boston, MA (US); Leonard Kogos, Salem, MA (US)

(73) Assignee: TRUSTEES OF BOSTON UNIVERSITY, Boston, MA (US)

( * ) Notice: Subject to any disclaimer, the term of this patent is extended or adjusted under 35 U.S.C. 154(b) by 133 days.

(21) Appl. No.: 16/754,919

(22) PCT Filed: Oct. 12, 2018

(86) PCT No.: PCT/US2018/055621
§ 371 (c)(1),
(2) Date: Apr. 9, 2020

(87) PCT Pub. No.: WO2019/075335
PCT Pub. Date: Apr. 18, 2019

(65) Prior Publication Data
US 2020/0321378 A1    Oct. 8, 2020

Related U.S. Application Data

(60) Provisional application No. 62/571,855, filed on Oct. 13, 2017.

(51) Int. Cl.
*H01L 27/146* (2006.01)
*H01L 31/028* (2006.01)
*G02B 5/18* (2006.01)

(52) U.S. Cl.
CPC ...... *H01L 27/14625* (2013.01); *G02B 5/1828* (2013.01); *H01L 27/1462* (2013.01); *H01L 31/028* (2013.01); *H01L 27/1463* (2013.01)

(58) Field of Classification Search
CPC ........... H01L 27/14625; H01L 27/1462; H01L 31/028; H01L 27/1463; H01L 31/02327; H01L 31/09; G02B 5/1828
(Continued)

(56) References Cited

U.S. PATENT DOCUMENTS

| 9,323,070 B2 | 4/2016 | Vink et al. |
| 2005/0056828 A1 * | 3/2005 | Wada ............... B82Y 10/00 257/40 |

(Continued)

OTHER PUBLICATIONS

Petefish "Nanostructured surfaces for surface plasmon resnonance spectroscopy and imaging" Iowa State University (2014).

*Primary Examiner* — Duy T Nguyen
(74) *Attorney, Agent, or Firm* — Nixon Peabody LLP; Ronald I. Eisenstein; David F. Crosby

(57) ABSTRACT

A lens-free ultrathin imaging sensor using a compound-eye vision modality can be formed by forming a metasurface on each pixel of an array of pixels in a solid state imaging sensor. The metasurface can be configured to form a diffraction grating that directs light incident on the metasurface at a predefined angle to excite surface plasmon polaritons into the solid state imaging sensor and light incident at any other angle is reflected or diffracted away from the metasurface. Each pixel of the imaging sensor can be configured using the metasurface to only receive light incident from a different portion of a field of view. A computational imaging system can be used to construct the image from the individual pixels.

15 Claims, 22 Drawing Sheets

(58) Field of Classification Search
USPC .......................................................... 257/431
See application file for complete search history.

(56) References Cited

U.S. PATENT DOCUMENTS

| | | | | |
|---|---|---|---|---|
| 2010/0320444 | A1* | 12/2010 | Dutta | .................... H01L 25/042 |
| | | | | 257/21 |
| 2012/0257304 | A1 | 10/2012 | Walters et al. | |
| 2013/0148194 | A1 | 6/2013 | Altug et al. | |
| 2014/0015548 | A1* | 1/2014 | Naughton | .......... G01N 27/3278 |
| | | | | 324/658 |
| 2014/0045730 | A1* | 2/2014 | Walters | .................... G01R 3/00 |
| | | | | 506/39 |
| 2014/0291479 | A1* | 10/2014 | Lu | ....................... H01L 27/1443 |
| | | | | 250/200 |
| 2017/0200760 | A1* | 7/2017 | Zhang | ............... H01L 27/14649 |

* cited by examiner

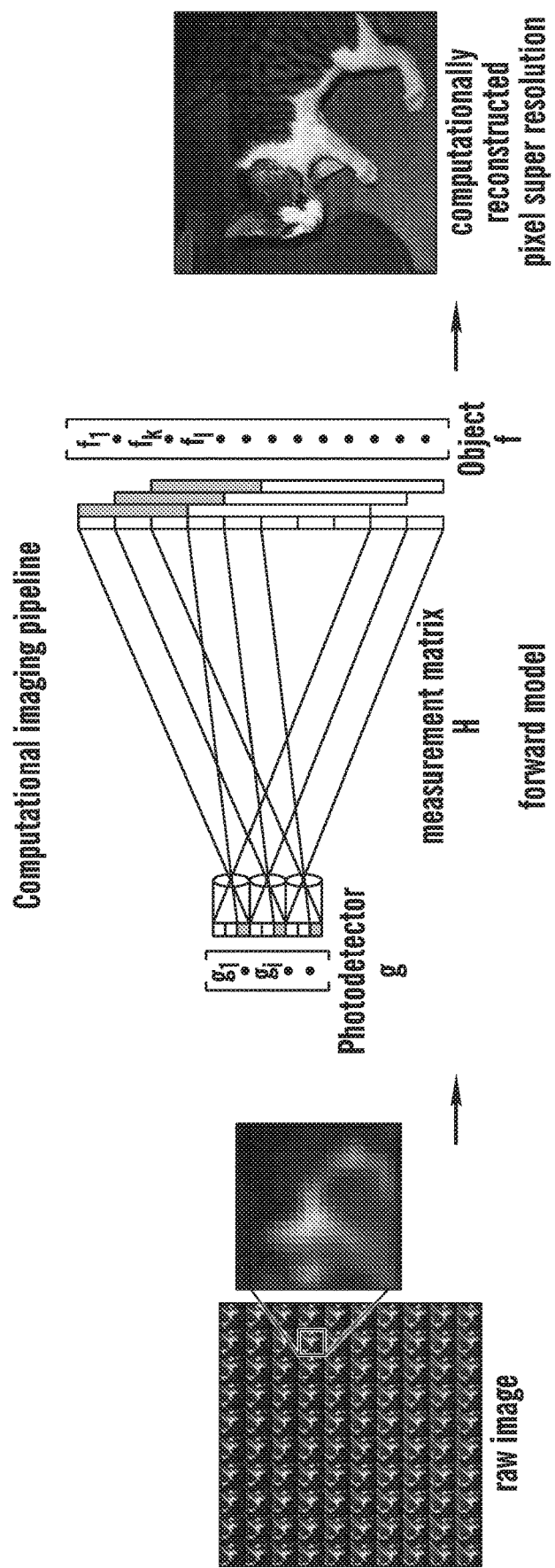

$$\begin{bmatrix} y_1 \\ y_2 \\ \cdot \\ \cdot \\ \cdot \end{bmatrix} = \begin{bmatrix} \cdots \\ & \cdots \\ & & \cdots \end{bmatrix} \cdot \begin{bmatrix} x_1 \\ x_2 \\ \cdot \\ \cdot \\ \cdot \end{bmatrix}$$

angular measurements     measurement matrix     object y    =    A     • x illuminated object
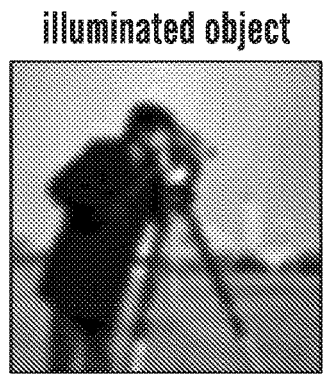
FIG. 14C
single-wavelength response  $\Delta\theta=4°\ \Delta\varphi=3°$ 2160 pixels  $\Delta\theta=6°\ \Delta\varphi=5°$ 841 pixels
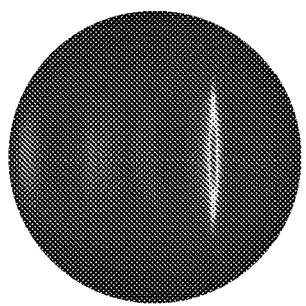  
FIG. 14D
broadband $\Delta\lambda/\lambda_0=20\%$  $\Delta\theta=4°\ \Delta\varphi=3°$ 2160 pixels
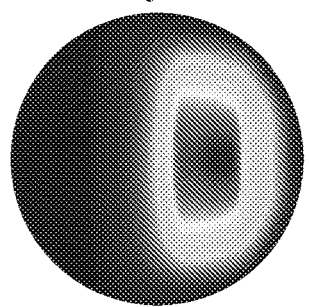 
FIG. 14E

LENS-FREE COMPOUND EYE CAMERAS BASED ON ANGLE-SENSITIVE META-SURFACES

CROSS-REFERENCE TO RELATED APPLICATIONS

This application is a 35 U.S.C. § 371 National Phase Entry Application of International Application No. PCT/US2018/055621 filed Oct. 12, 2018, which designates the U.S. and claims any and all benefits as provided by law including benefit under 35 U.S.C. § 119(e) of the U.S. Provisional Application No. 62/571,855 filed Oct. 13, 2017, the contents of which are incorporated herein by reference in their entireties.

STATEMENT REGARDING FEDERALLY SPONSORED RESEARCH

This invention was made with government support under grant no. DE-FG02-06ER46332 awarded by U.S. Department of Energy. The government has certain rights in the invention.

REFERENCE TO MICROFICHE APPENDIX

Not Applicable

BACKGROUND

Technical Field of the Invention

The present invention is directed to a lens-free compound eye imaging sensor that includes a plurality of pixels and each pixel includes a metasurface configured to allow only light incident at a predefined angle to be detected. By configuring each pixel to only receive light from a different portion of the field of view, an image of the field of view can be constructed from the array of pixels without using a focusing lens.

Description of the Prior Art

In recent years, several attempts to develop artificial compound-eye cameras have been reported, based on both planar and curved arrays of image sensors combined with carefully aligned arrays of microlenses. So far, however, the development of practical cameras based on this idea has been hindered by fabrication complexity, mostly related to the critical need for accurate alignment between the two arrays and challenges caused by the formation of ghost images. Furthermore, designs involving curved substrates are not immediately compatible with standard microelectronic circuits.

Compound eyes (found in nature in most small invertebrates) represent the optimally adapted solution to provide large fields of view with negligible distortion and spherical aberration within the smallest possible package. Furthermore, they can create focused images of objects at arbitrary distances without the need for any focal-length adjustment, and therefore they offer nearly infinite depth of field and extremely high acuity to motion. Their optoelectronic implementation described in this disclosure would enable extending the same desirable features to artificial image sensors.

SUMMARY

The present invention consists of a lens-free ultrathin imaging sensor based on the compound-eye vision modality, comprising an array of imaging elements, each element can be configured to detect only that portion of light incident on the imaging element that propagates along a predefined angular direction (e.g., from a predefined direction within the field of view). One advantage over traditional lens based imaging sensors used in conventional cameras is that imaging sensors according the invention provide for extreme size miniaturization, nearly infinite depth of field, high acuity to motion, and large dynamic range.

The imaging sensors according to some embodiments of the invention are lens-free, and rely on the use of planar plasmonic metasurfaces (i.e., arrays of metallic nanoantennas or nanoparticles) that preferentially transmit into their substrate light incident along a single predefined or geometrically tunable direction, while at the same time reflecting light from all other directions. These metasurfaces can be directly integrated with standard CMOS or CCD image sensor arrays, where they can be accurately aligned to their respective photodetector pixels by lithography, without any complicated packaging process. In addition, they are intrinsically polarization sensitive, and therefore can be used to harness the distinct advantages of polarization vision such as reduced glare and improved contrast.

The elements of this invention that make it unlike anything else include: 1) the use of angle-sensitive metasurfaces for the implementation of directional photodetectors and artificial compound-eye cameras; 2) the specific design of angle-sensitive metasurfaces involving nanoantenna arrays with asymmetric unit cells; 3) the design of angle-sensitive metasurfaces involving a combination of slits, grating coupler, and grating reflector; and 4) the design of angle-sensitive metasurfaces providing preferential transmission for a fixed preselected polarization state.

In accordance with some embodiments of the invention, the metasurface can be designed and constructed to transmit into its photosensitive substrate light incident along a few (rather than only one) selected directions. With advanced signal processing, the resulting compound-eye cameras can use a smaller number of pixels to provide the same resolution.

The nanoantennas in the metasurface can be fabricated using dielectric materials instead of metals, in order to improve the peak transmission at the desired angle of incidence.

Efficient transmission across the metal film may be obtained with an ultrathin film without slits, with a dielectric coating on the top surface used to produce phase matching between the surface plasmon polaritons guided on both sides of the film. This approach can be used to simplify the fabrication process.

In accordance with some embodiments of the invention, the imaging sensor can include at least one pixel sensor configured to produce an electrical signal in response to an optical signal received at a first surface of the single pixel sensor, a metal film layer disposed over at least a portion of the first surface, the metal film including a top surface and a bottom surface, a first dielectric layer disposed between the first surface and the bottom surface of metal film layer and a second dielectric layer disposed over at least a portion of the top surface of the metal film layer, a periodic array of nanoparticles disposed on the second dielectric layer, the periodic array of nanoparticle being arranged in a predefined configuration such that light incident on the array of nanoparticles within a predefined range of angles with respect to periodic array of nanoparticles is diffracted by the array of nanoparticles into surface plasmon polaritons that propagate along the top surface of the metal film and become absorbed by the first surface and cause the at least one pixel sensor to produce an electrical signal, and wherein light incident on the array of nanoparticles that is not within the predefined range of angles is not diffracted into surface plasmon polaritons that propagate along the top surface of the metal film.

In accordance with some embodiments of the invention, the image sensor can include an array of pixel sensors forming a solid state photo detector material having a first surface configured to receive surface plasmon polaritons, and a metasurface coupled to the first surface of the solid state photo detector material, the metasurface include a metal film layer disposed over at least a portion of the first surface, the metal film including a top surface and a bottom surface, a first dielectric layer disposed between the first surface and the bottom surface of metal film layer and a second dielectric layer disposed over at least a portion of the top surface of the metal film layer, and an array of nanoparticles arranged on the second dielectric layer forming a grating coupler section and a slits section.

In accordance with some embodiments of the invention, the image sensor can include the grating coupler section formed from a periodic array of nanoparticles arranged in a predefined configuration such that light incident on the array of nanoparticles within a predefined range of angles with respect to periodic array of nanoparticles is diffracted by the array of nanoparticles into surface plasmon polaritons that propagate along the top surface of the metal film layer, and wherein the slits section can be positioned on a first side of the grating coupler section comprising a plurality of slits extending through the second dielectric layer, the metal film layer and the first dielectric layer to the solid state photo detector material such that the surface plasmon polaritons propagating along the top surface of the metal film layer propagate into the solid state photo detector material.

In accordance with some embodiments of the invention, the metasurface of the image sensor can include a reflector section positioned on a side opposite to the first side and the reflector section further includes a grating of nanoparticles configured to reflect the surface plasmon polaritons away from the reflector section.

These and other capabilities of the invention, along with the invention itself, will be more fully understood after a review of the following figures, detailed description, and claims.

BRIEF DESCRIPTION OF THE FIGURES

The accompanying drawings, which are incorporated into this specification, illustrate one or more exemplary embodiments of the inventions and, together with the detailed description, serve to explain the principles and applications of these inventions. The drawings and detailed description are illustrative, and are intended to facilitate an understanding of the inventions and their application without limiting the scope of the invention. The illustrative embodiments can be modified and adapted without departing from the spirit and scope of the inventions.

FIGS. 4A-4C show a computational imaging pipeline of an integral imager according to some embodiments of the invention. FIG. 4A shows the raw images that consist of sub-images from different perspectives with overlapping angular fields of view. FIG. 4B shows that for image reconstruction, the imager according to some embodiments of the invention can be modeled as a linear system that relates all the sub-images to the object by a measurement matrix. FIG. 4C shows that solving the inverse problem allows recovering an image with much higher resolution than from the raw sub-images.

FIG. 7A shows the Power transmission coefficient at $\lambda_0=800$ nm through several metasurfaces for p polarized light versus angle of incidence θ on the x-z plane. FIG. 7B shows a far-field radiation pattern produced across one of these metasurfaces, corresponding to the red trace in FIG. 7A, by a dipole source in the Si substrate.

FIG. 9A shows that each angle-sensitive pixel integrates the light intensity from a set of angles. FIG. 9B shows the measurement from the pixel array is related to the object by a linear equation, in which the measurement matrix contains the pixel angular response. FIG. 9C shows a simulation of reconstructed images using different spacing in the polar ($\theta$) and azimuthal ($\phi$) angles. FIG. 9D show a simulated reconstruction using different pixel responsivities: (d1) monochromatic light; (d2) broadband light; (d3) symmetric pixels; (d4) and (d5) angular multiplexing, using (d4) 2D gratings and (d5) long-pitch gratings that support two diffraction orders.

FIG. 10 shows a schematic illustration of polarization imaging data acquisition and reconstruction.

FIG. 13A shows a power transmission coefficient plot at $\lambda_o=1550$ nm through several metasurfaces for p polarized light versus angle of incidence $\theta$ on the x-z plane. FIG. 13B shows the far-field radiation pattern produced across one of these metasurfaces, corresponding to the blue trace in FIG. 13A, by a dipole source in the Ge substrate. In all devices, the Au film is 100-nm thick, both SiO2 layers are 60-nm thick, and the Au NP height is 50 nm. The slit section contains five 200-nm-wide slits, and the reflector consists of five repeat units with 1524-nm period. The NP-array section is approximately 39-$\mu$m long and its period ranges from 1403 to 742 nm for increasing $\theta_{max}$.

FIGS. 14A-14E show a process for data acquisition and image reconstruction using the proposed compound-eye cameras according to some embodiments of the invention. FIG. 14A shows a schematic diagram of the imaging geometry. FIG. 14B shows the computational method. FIG. 14C shows the object used in the simulations. FIG. 14D shows the simulation results for single-wavelength illumination; the left panel of FIG. 14D shows the representative response of a single pixel. The middle and right panels of FIG. 14D show reconstructed images for different spacings in the polar ($\theta$) and azimuthal ($\phi$) angles. FIG. 14E shows, in the left panel, the representative response of a single pixel and, in the right panel, the reconstructed image for broadband illumination.

FIG. 16A shows a plot of the polarization-resolved photocurrent versus polar angle of incidence for two devices constructed using the design of FIG. 12 with different periods $\Lambda$ of the grating coupler. FIG. 16B shows the same plot as in FIG. 16A for an otherwise identical device without any metasurface between the metal contacts.

DETAILED DESCRIPTION OF PREFERRED EMBODIMENTS

Figure 1A:
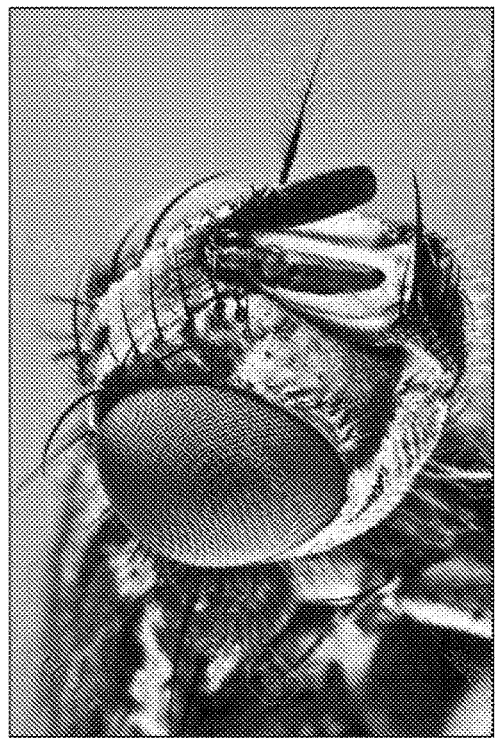
FIG. 1A shows the head of a horse fly with huge compound eyes.

The present invention is directed to imaging sensors (e.g. for cameras) that can provide fast panoramic vision across a wide field of view using a highly miniaturized platform. Specific application areas that would greatly benefit from these features include machine vision, surveillance, and endoscopic medical imaging. For example, cameras according to the invention can be used to sense the relative motion between an observer and its surroundings, and therefore can be used in cars and other terrestrial or aerial vehicles for obstacle or collision avoidance, surveillance, and ultimately autonomous navigation. Extreme size miniaturization in this context is particularly interesting for the development of microscopic aircrafts directly inspired by flying insects. Similarly, again because of their small size and large field of view, the cameras according to the invention can provide enhanced imaging capabilities in constricted or nontraditional environments such as chip-on-the-tip endoscopes and wearable electronics. The individual directional photodetectors used in these cameras can also be used as receivers, for example, in optical wireless communication systems (e.g., LiFi).

The present invention consists of a lens-free ultrathin imaging sensor based on the compound-eye vision modality, comprising an array of many imaging elements, each providing detection of light incident along a different direction. One advantage compared to traditional single-lens imaging sensors used in conventional cameras is that it provides for extreme size miniaturization, nearly infinite depth of field, high acuity to motion, and large dynamic range.

The imaging sensors according to some embodiments of the invention are lens-free, and rely on the use of planar plasmonic metasurfaces (i.e., arrays of metallic nanoantennas) that preferentially transmit into their substrate light incident along a single geometrically tunable direction, while at the same time reflecting light from all other directions. These metasurfaces can be directly integrated with standard CMOS or CCD image sensor arrays, where they can be accurately aligned to their respective photodetector pixels by lithography, without any complicated packaging process. In addition, they are intrinsically polarization sensitive, and therefore can be used to harness the distinct advantages of polarization vision such as reduced glare and improved contrast.

The elements of this invention that make it unlike anything else include: 1) the use of angle-sensitive metasurfaces for the implementation of directional photodetectors and artificial compound-eye cameras; 2) the specific design of angle-sensitive metasurfaces involving nanoantenna arrays with asymmetric unit cells; 3) the design of angle-sensitive metasurfaces involving a combination of slits, grating coupler, and grating reflector; and 4) the design of angle-sensitive metasurfaces providing preferential transmission for a fixed preselected polarization state.

In accordance with some embodiments of the invention, the metasurface can be designed and constructed to transmit into its photosensitive substrate light incident along a few (rather than only one) selected directions. With advanced signal processing, the resulting compound-eye cameras can use a smaller number of pixels to provide the same resolution.

The nanoantennas in the metasurface can be fabricated using dielectric materials instead of metals, in order to improve the peak transmission at the desired angle of incidence.

Efficient transmission across the metal film may be obtained with an ultrathin film without slits, with a dielectric coating on the top surface used to produce phase matching between the surface plasmon polaritons guided on both sides of the film. This approach can be used to simplify the fabrication process.

The present invention is directed to the development of lens-free ultrathin imaging sensors and cameras based on the compound-eye vision modality. Compound eyes can be found in many small invertebrates, and consist of an array of many imaging elements (normally lenses and photoreceptors), each oriented so as to detect light incident along a different direction in a field of view. These systems represent the optimally adapted solution to provide large fields of view with the smallest possible volume (compared to traditional single-lens eyes). Furthermore, they offer nearly infinite depth of field and extremely high acuity to motion. The optoelectronic implementation according to the embodiments of the invention, enable extending the same desirable features to image sensors for a wide range of applications, including machine vision, surveillance, and endoscopic medical imaging.

In accordance with some embodiments of the invention, the camera can include plasmonic metasurfaces that are configured to transmit light incident along a geometrically tunable direction (within a small range of angles) into their substrate, while at the same time reflecting light from all other directions. In accordance with some embodiments, the present invention can be used in an artificial compound-eye imaging sensor or camera that includes a planar array of photodetectors, each coated with a different metasurface designed and configured to allow for the detection of light from a predefined different direction (or within a small range of directions). The artificial compound-eye camera according the invention can be constructed without lenses enabling the overall camera thickness to be dramatically miniaturized compared to existing technologies. In addition, the metasurfaces are also intrinsically polarization sensitive, and therefore can be configured to benefit from the advantages of polarization vision, such as, reduced glare and improved contrast. The metasurfaces according to the invention can be directly integrated with prefabricated CMOS or CCD image sensor arrays, where they can be accurately aligned to their respective pixels by lithography, without any complicated packaging process.

Figure 1B:
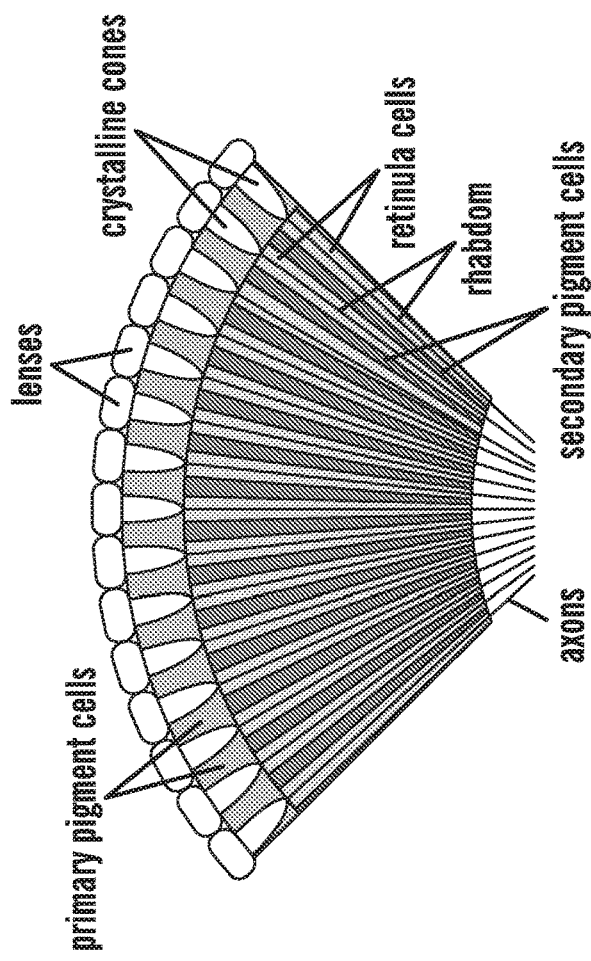
FIG. 1B shows a schematic illustration of the apposition compound eye of an insect.

Compound eyes are quite pervasive in nature, where they are found in most arthropods such as insects and crustaceans. FIG. 1A shows a picture of a compound eye. While different types exist, their basic architecture consists of an array of many imaging elements—known as ommatidia—pointing along different directions as shown in FIG. 1B. In the case of apposition compound eyes (the most common vision modality in nature), neighboring elements are optically isolated from one another and only detect light incident along a single direction (within a small range). As a result, each element only collects a single point of information about the object being imaged. The full image of the object is then formed in the brain from the combined inputs of all the ommatidia.

One useful feature of compound eyes is their ability to provide a wide-angle field of view with negligible distortion and spherical aberration within the smallest possible package [1]. In addition, they can create focused images of objects at arbitrary distances without the need for any focal-length adjustment, and therefore they offer nearly infinite depth of field and extremely high acuity to motion. These favorable properties are well illustrated by the exceptional reaction time of familiar fruit flies to incoming threats. On the other hand, the spatial resolution of compound eyes is generally inferior to that of single-lens eyes, mostly limited by their diminutive size. Image sensors based on the compound-eye modality are therefore ideally suited for fast panoramic vision across a wide field of view in a highly miniaturized platform [2].

Specific application areas that would benefit from these properties include machine vision, surveillance, and endoscopic medical imaging. For example, the proposed compound-eye cameras appear to be well suited to sense the relative motion between an observer and its surroundings, and therefore could be used in cars and other terrestrial or aerial vehicles for obstacle avoidance, surveillance, and ultimately autonomous navigation. Extreme size miniaturization in this context is particularly interesting for the development of microscopic aircrafts directly inspired by flying insects [2]. By virtue of their small size and large field of view, these cameras could provide enhanced imaging capabilities in constricted or nontraditional environments such as chip-on-the-tip endoscopes and wearable electronics.

In recent years, several attempts to develop optoelectronic compound eyes have been reported [3-7], based on both planar and curved arrays of artificial ommatidia. The planar geometry has the important advantage of more straightforward compatibility and ease of integration with standard microelectronic circuits (which are based on planar substrates), as well as smaller overall volume.

Figure 2B:
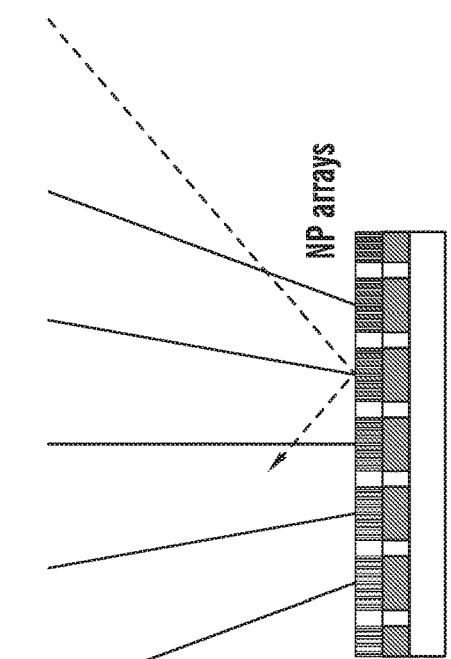
FIG. 2B shows a compound-eye camera based on the proposed metasurfaces according to some embodiments of the invention. The dashed regions of different colors in FIG. 2B represent arrays designed to enable detection of light from different directions.
Figure 2A:
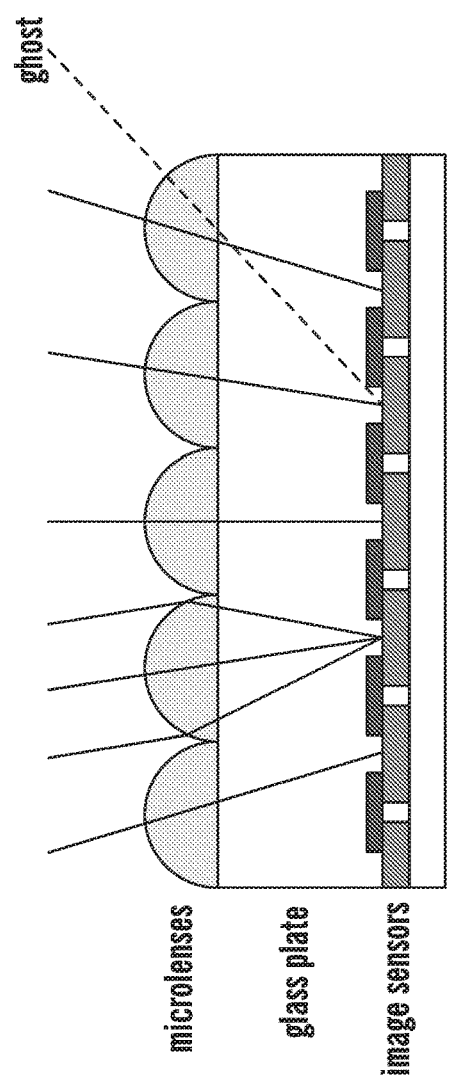
FIG. 2A shows a compound-eye camera based on a planar lens array (a) and on the proposed metasurfaces.

An example of a prior art flat compound-eye camera is shown in FIG. 2A [3, 5], consisting of a microlens array and an optoelectronic sensor array separated by a glass plate with thickness equal to the focal length of the microlenses. By design, the two arrays have different periodicities, so that each sensor detects light incident along a different direction, as required in the apposition compound-eye vision modality. Pinholes in front of each photodetector can also be used to control the tradeoff between sensitivity and angular resolution. However, the development of practical imaging sensors and cameras based on this approach has so far been hindered by fabrication complexity, mostly related to the critical need for accurate alignment between the two arrays. The possible formation of ghost images, as illustrated by the dashed line in FIG. 2A, also introduces additional fabrication challenges, which would require for instance the insertion of opaque walls in the glass plate to isolate neighboring pixels and thus eliminate crosstalk [3].

The present invention is directed a planar compound-eye imaging sensor that does not rely on traditional refractive focusing, but instead employs specially designed diffractive metasurfaces (e.g., nanoantenna arrays) that can preferentially transmit light incident along a desired direction, integrated with each pixel as shown in FIG. 2B. With this approach, lens-free image sensors can be developed with overall thickness essentially as small as that of the photodetector chip. Furthermore, since the nanoantenna arrays can be fabricated, for example, using lithography, their alignment to their respective pixel is straightforward, and inter-pixel crosstalk can be avoided.

The imaging sensing devices according to the present invention can also be designed and constructed to provide polarization dependent light detection. Thus, they can mimic another important attribute of the compound eyes of several arthropods (such as the mantis shrimp), i.e., the ability to sense polarization through the presence of polarization filters in the ommatidia [1, 8]. In turn, polarization vision can offer important advantages, including the reduction of glare caused by reflections from a planar background, the visualization of the surface orientation of single-color objects, and dehazing for imaging in degraded environment [8-15]. As a result, the detailed shape of the object can be resolved more clearly, particularly in the presence of limited color contrast or transparent features.

Figure 3A:
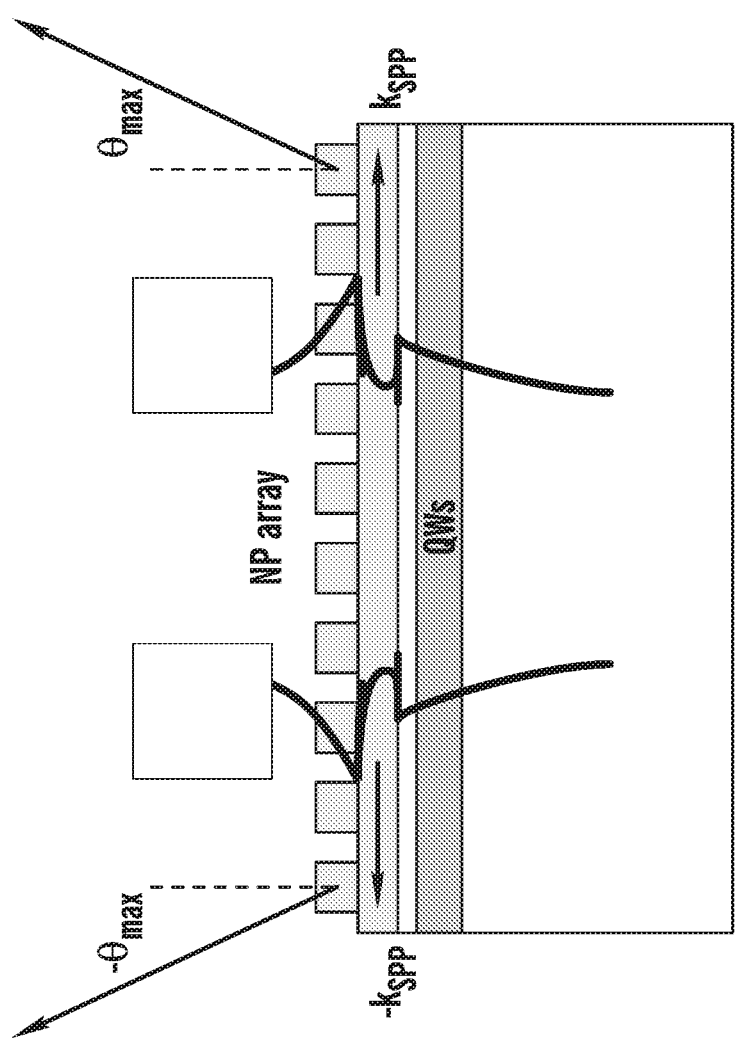
FIG. 3A shows a schematic cross section of the device geometry of ref. 20.

Metallic nanoparticle (NP) arrays have been previously used to enhance the efficiency and functionality of light emitting devices [16-21], including the demonstration of plasmonic unidirectional beaming of luminescence [20]. An example of these systems is shown in FIG. 3A, where an LED active material (consisting of InGaN/GaN quantum wells emitting near 500 nm) is coated with an ultrathin Ag film supporting a periodic array of Ag NPs. In this geometry, most excitons in the quantum wells recombine through the near-field excitation of surface plasmon polaritons (SPPs) propagating along the metal film, because of the highly confined optical fields of SPPs and resulting Purcell enhancement effects [22]. Due to its ultra-small thickness (40 nm), the Ag film supports hybrid SPP modes that extend over both its bottom and top surfaces, as illustrated by the red lines in FIG. 3(a). Efficient light emission across the film can then occur through the diffractive scattering of the excited SPPs by the overlaying NP array.

Figure 3B:
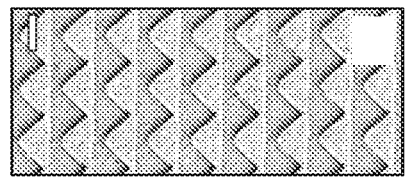
FIG. 3B shows a grating array designed to produce light emission along two equal and opposite directions, according to some embodiments of the invention.

In particular, light produced via diffractive scattering of these hybrid SPPs emerges from the sample surface at an angle $\theta_{max}$, as shown in FIG. 3A, determined by the diffraction condition $2\pi \sin \theta_{max}/\lambda_0 + 2q\pi/\Lambda = \pm k_{SPP}$, where $\lambda_0$ is the wavelength, $\Lambda$ the array period, q the diffraction order, and $k_{SPP}=2\pi/\lambda_{SPP}$ the SPP wavenumber. If the array consists of a simple one-dimensional grating of y-oriented rectangular ridges. As shown in FIG. 3B], first-order diffraction of forward and backward travelling SPPs (along the x direction) leads to the emission of two output beams along equal and opposite angles $\pm\theta_{max}$ (on the x-z plane).

Figure 3C:
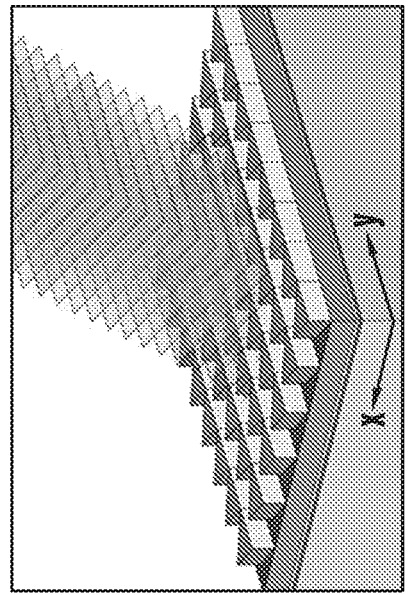
FIG. 3C shows a triangular NP array designed to produce light emission along a single off-axis direction according to some embodiments of the invention.
Figure 3D:
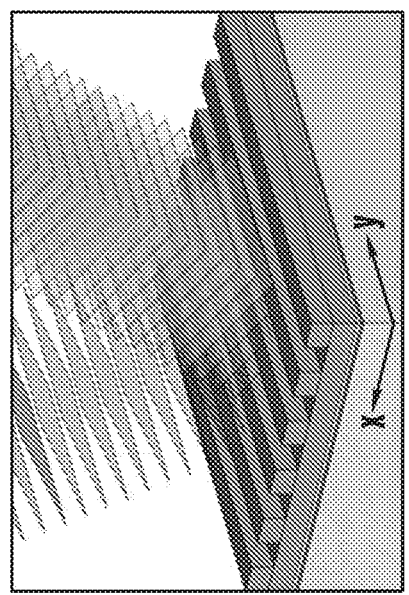
FIG. 3D shows a SEM image of a triangular NP array. The scale bar is 500 nm.

Off-axis unidirectional light emission (again on the x-z plane) can then be obtained using asymmetric grating lines, designed to suppress diffractive scattering of forward traveling SPPs in favor of backward diffraction (or vice versa). The geometry used in this work consists of lines of triangular NPs, as shown in the diagram of FIG. 3C and in the top-view SEM image of FIG. 3D.

Figure 3E:
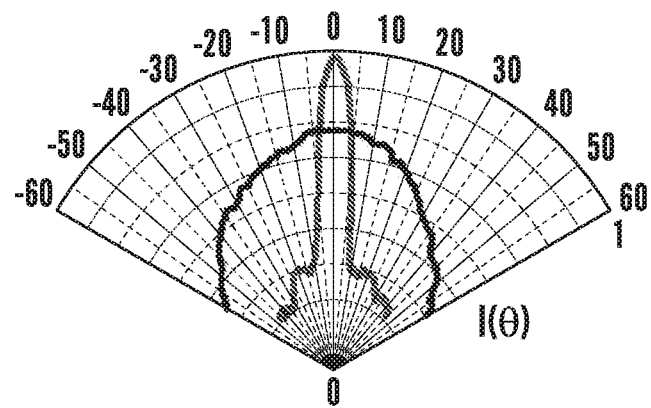
FIG. 3E shows experimental p-polarized far-field radiation patterns measured with a 1D grating of period $\Lambda=\lambda_{SPP}$ (red trace) and with an otherwise identical uncoated sample (blue trace, normalized to the peak value of the red trace).
Figure 3F:
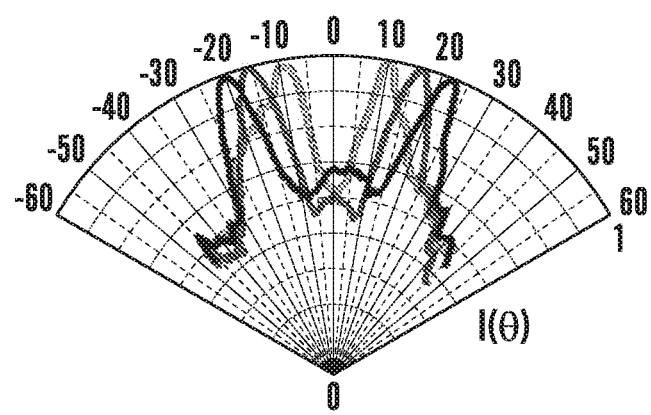
FIG. 3F shows radiation patterns measured with 1D gratings of different periods $\Lambda>\lambda_{SPP}$.
Figure 3G:
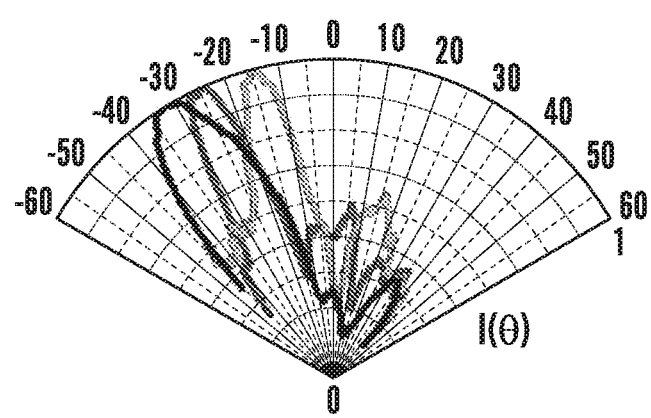
FIG. 3G shows radiation patterns measured with different arrays of triangular NPs. The traces in (f) and (g) are normalized to unit peak values.

This behavior is observed in the measured far-field radiation patterns shown in the polar plots of FIGS. 3E-3G (i.e., output intensity I versus emission angle θ on the x-z plane). In all these samples, the output light is found to be predominantly p-polarized (consistent with the polarization properties of SPPs [23]), and therefore only p-polarized data are shown here. The red trace 302 of FIG. 3E corresponds to a 1D grating with period Λ=400 nm (close to the expected SPP wavelength $\lambda_{SPP}$, so that the first-order diffraction condition is satisfied for $\theta_{max}$=0). Strong collimation along the surface normal is obtained, with a small full-width divergence angle of about 12°. By comparison, a Lambertian profile with much larger (>110°) divergence is measured from the same samples without any metallic coating, as shown by the blue trace 304 in FIG. 3E. The comparison between these two traces also shows that the p-polarized intensity in the direction of peak emission can be increased by the NP array relative to an otherwise identical bare sample, due to the aforementioned Purcell enhancement effects. At larger grating periods Λ, the far-field pattern consists of two output beams propagating along equal and opposite angles $\pm\theta_{max}$, as shown in FIG. 3F. Finally, the traces of FIG. 3G correspond to the triangular-NP geometry of FIG. 3C for different values of the array period and NP size. In this case, off-axis unidirectional beaming is obtained, with most of the output light emitted in a single beam at a nonzero angle with respect to the surface normal. The beaming angle can be tuned by varying the array geometrical parameters, as illustrated in the figure.

These experimental observations are well reproduced by finite difference time domain (FDTD) simulations [20] based on the principle of reciprocity [24], where the structure under study is illuminated with an incident plane wave from above, and the resulting optical field intensity in the active region below the Ag film is computed as a function of angle of incidence.

In the geometry of FIG. 3A, efficient light emission across the metal film requires a strong coupling between the SPPs guided at the film bottom surface (which are excited by the underlying active layer) and the SPPs guided at the top surface (which are diffracted into radiation by the NPs). Such coupling leads to the formation of the hybrid SPP modes illustrated by the red lines in FIG. 3A. In applications to directional photodetection, the same hybrid SPPs can be efficiently excited via diffraction of the incident light by the NPs and then efficiently absorbed in the active layer. However, since the two surfaces of the metal film are in contact with different dielectric environments, their respective SPPs are not phase matched with one another, which limits their mutual coupling [23] and the resulting transmission across the film. This limitation can be expected to become more significant in the proposed directional photodetectors based on Si (where the refractive index n≈3.7), as compared with the GaN light emitting devices of FIG. 3A (where n≈2.4, i.e., much closer to the refractive index of the air above the film).

In accordance with some embodiments of the invention, the metal film can be periodically perforated with a few slits having a subwavelength width. As a result, the coupling between SPPs guided at the two film surfaces can be highly enhanced through the spatial overlap of their evanescent fields inside the slits, in analogy with the phenomenon of extraordinary optical transmission [25-28]. When an SPP propagating on the top metal surface reaches the slit boundaries, a line of in-plane oscillating dipoles is effectively established across the slit. Such effective dipoles can then excite SPPs on the bottom surface of the film, and at the same time emit radiation mostly propagating into the higher-index substrate [29]. This behavior in reverse has already been widely employed for the efficient excitation of SPPs on the top surface of a perforated metal film, via illumination from the back side [30-32].

In the triangular NP arrays of FIG. 3C first-order diffraction of SPPs in the "forward x direction" (i.e., the q=+1 order) is suppressed relative to backward diffraction (q=−1). While effective for the initial demonstration of FIG. 3G, this array geometry can only provide a limited number of design degrees of freedom for the optimization of the resulting angular response, e.g., in terms of tuning range, asymmetry, angular selectivity, and polarization dependence.

These systems consist of planar arrays of nanoantennas with sub-wavelength separation and spatially varying size, shape, and/or orientation, designed to introduce a position-dependent phase shift in the light reflected from and/or transmitted through the array. In their simplest implementation, they produce a linear phase gradient $\bar{\xi}$ along a single in-plane direction û. As a result, incident light of in-plane wavevector p is scattered into a reflected and/or transmitted wave of in-plane wavevector p+û$\bar{\xi}$, while all other orders of diffraction are, in principle, completely suppressed. Such linearly graded metasurfaces therefore essentially behave like blazed diffraction gratings [44], with the distinctive advantages of ultrathin flat geometry and simple fabrication involving only planar processing steps. In recent years, these and similar metasurfaces have been used for a wide range of applications, including ultrathin lenses [39, 42], holograms [36, 40], polarization control devices [38, 41, 43], and the generation of optical vortices [33, 37, 41].

Computational imaging is an emerging discipline at the interface between optics and signal processing [45-48]. Previous approaches to capture angle-resolved information from different spatial locations can be found in the context of integral or light-field imaging [49-51]. This technique involves placing a pinhole or microlens array in front of an optoelectronic sensor array, so that each sub-aperture projects on a subset of photodetectors an image of the object from a different perspective as shown in FIG. 4A. Computational imaging then provides a framework to systematically combine information from all the sub-images (which are intrinsically limited to low spatial resolution) to reconstruct a pixel super-resolved image. This is achieved in two-steps. First, the image-formation process is modeled as a linear system that relates the image to the object by a measurement matrix as shown in FIG. 4B. Second, computational reconstruction is achieved by inverting the linear system to produce the final image as shown in FIG. 4C.

A similar computational imaging approach was also used in alternative compact camera designs using diffractive elements to replace refractive lenses [52-54]. Among these reports, the more closely related technology to the proposed research is the planar-Fourier-capture-array camera of ref. 52, where two standard metallic diffraction gratings are fabricated on top of each pixel to produce a sinusoidal dependence of the photodetector responsivity on illumination angle. With this arrangement, due to the symmetric response of standard gratings, the image reconstruction is fundamentally limited by the bi-directional ambiguity. This ambiguity could be suppressed by using three additional π/2 phase-shifted gratings oriented along the same direction [52], at the expense, however, of a 4× efficiency reduction. Furthermore, all the lens-free cameras of refs. 52-54 follow a global architecture, i.e., their point-spread functions (PSFs) spread over the entire field of view. This means that the reconstruction of the final image relies on a global deconvolution procedure that is applied to the captured image using a set of pre-calibrated PSFs. The main challenge of this global design is robustness—for example, any PSF miscalibration would result in artifacts in the entire reconstructed image, and a high dynamic-range scene with a high-brightness object occupying a small angular field of view could "blind" the entire system.

The metasurface-based compound-eye cameras according to some embodiments of the invention follow instead a parallel architecture, where each pixel is decoupled from the rest, similar to the case of integral imaging. The main difference is that each pixel in our system does not produce a sub-aperture image, but only an integrated photon-count value, which allows for a much more compact design but with resolution limited by the pixel's finite angular selectivity. To improve the resolution, we can take a similar computational imaging approach. The main idea is that by designing pixels having appropriate overlaps in their angular responses, resolution is no longer dictated by each pixel alone, but by how much the responses differ. This allows us to computationally reconstruct super-resolved images by solving the underlying linear inverse problem.

In accordance with some embodiments of the invention, the lens-free directional image sensors can include asymmetric plasmonic metasurfaces, designed for operation at a representative wavelength, for example, within the Si absorption band $\lambda_0$=800 nm. Computational imaging tools can be employed to determine how to optimally reconstruct an image from the combined outputs of an array of such imaging devices.

Figure 5A:
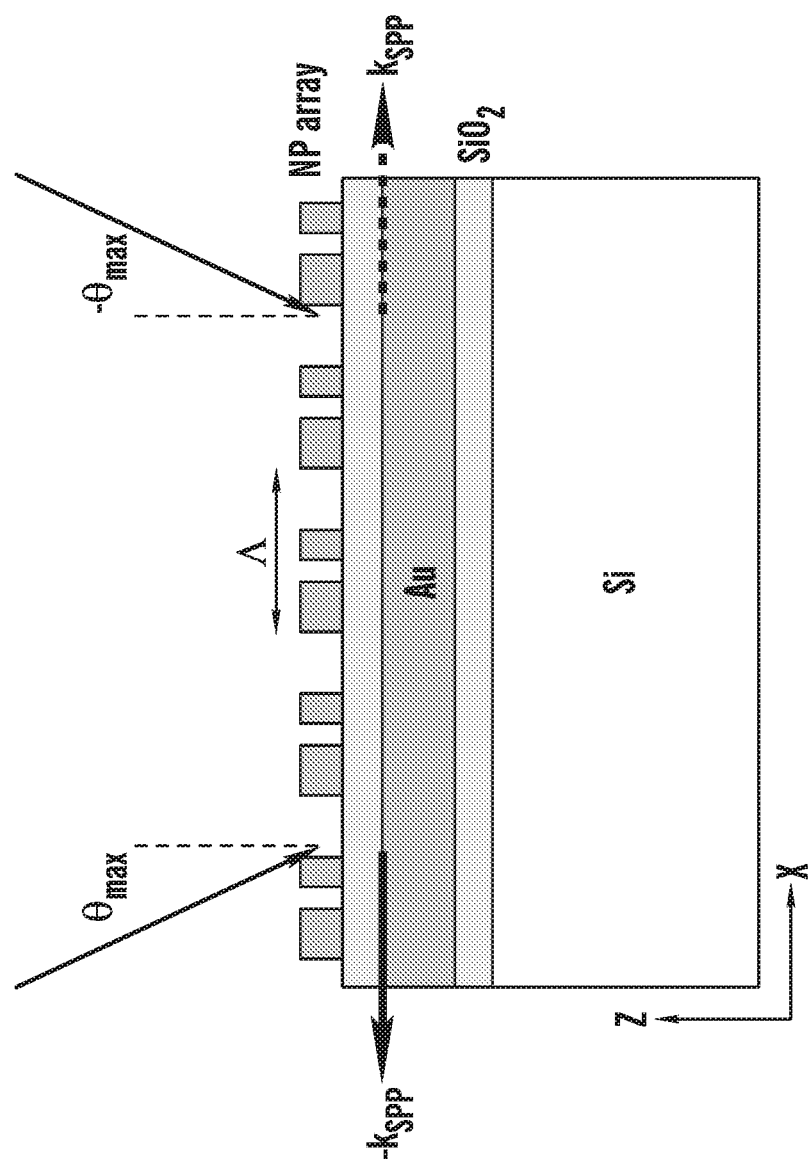
FIG. 5A shows a schematic cross-sectional view of the imaging devices according to some embodiments of the invention. The solid (dashed) red arrow represents excited SPPs having large (small) amplitude due to constructive (destructive) interference between the diffracted waves from the two NPs in each unit cell.

The basic geometry of some embodiments of the invention is shown in FIG. 5A. Similar to FIG. 3A, the device active material (in this case a Si photoactive absorbing layer) can be coated with a metal film supporting a periodic array of metallic NPs. For example, gold can be used as the material for all metallic features, due to its favorable plasmonic properties in the spectral region of interest. However, other materials that support surface plasmon polariton modes, such as all noble metals, appropriately doped semiconductors and graphene can also be used, for example, in embodiments that support surface plasmon modes outside the visible spectrum (e.g., graphene would be applicable in the Gigahertz and Terahertz frequency range). Two SiO2 layers can be inserted immediately below and above the Au film, to provide electrical insulation from the active layer and to control the film-NP coupling, respectively. The array period Λ can be selected based on the diffraction condition $(2\pi \sin \theta_{max})/\lambda_0 - 2\pi/\Lambda = -k_{SPP}$, so that light incident at the predefined angles $\pm\theta_{max}$ (on the x-z plane) can be coupled via first-order diffraction into SPPs propagating on the top surface of the Au film along the ∓x directions. At the same time, the excitation of such SPPs in the +x direction can be suppressed through the asymmetric design of the array unit cells. Light incident at any other angle can be completely reflected (or diffracted) away from the surface; in particular, the excitation of SPPs by all higher orders of diffraction can be avoided by keeping the period Λ smaller than the SPP wavelength $\lambda_{SPP}=2\pi/k_{SPP}$.

In accordance with some embodiments of the invention, the metasurface can be a dielectric metasurface that is constructed using a dielectric film and dielectric nanoparticles configured to form a diffracting grating (e.g., without the use of a metal film layer and second dielectric layer) that can be used to selectively pass light propagating along an angle of incidence and couple the light to the high-index semiconductor (e.g., Si or Ge) sensing substrate. In addition, some embodiments of the invention can be used to image other frequencies of electromagnetic radiation (e.g., gigahertz and terahertz radiation) by modifying the structures of the metasurfaces (e.g., the dimensions of the nanoparticle grating and the thickness of the nanoparticles, the metal layers and/or the dielectric layers) for the frequencies and/or wave lengths of the electromagnetic radiation as provided herein.

Finally, as described in the next section, subwavelength slits in the Au film can be used to scatter the excited SPPs into radiation propagating predominantly into the high-index semiconductor (e.g., Si or Ge) substrate, where a photocurrent is produced. As a result, the device angle-resolved responsivity pattern can be expected to be peaked at the angle of incidence $+\theta_{max}$. Alternatively, in accordance with some embodiments, the metal film can be sufficiently thin such as to allow the formation of hybrid SPP modes that couple across the metal film (e.g., form SPP modes on the bottom surface of the film) and the second dielectric layer can be made sufficiently thin (or omitted) such that the bottom surface of the metal film (which can be textured to propagate radiation) is sufficiently close to (or in contact with) the semiconductor substrate causing the radiation to propagate in to the semiconductor substrate and causing a photocurrent to be produced. In accordance with some embodiments, the thickness of the metal layer can approximately 5% to 15% of the wavelength of the incident radiation to be detected. Thus, for the visible spectrum, a metal film of approximately 50 nm (or 10% of the 500 nm wavelength) would allow the 500 nm radiation to propagate in to the semiconductor detector substrate.

Figure 5C:
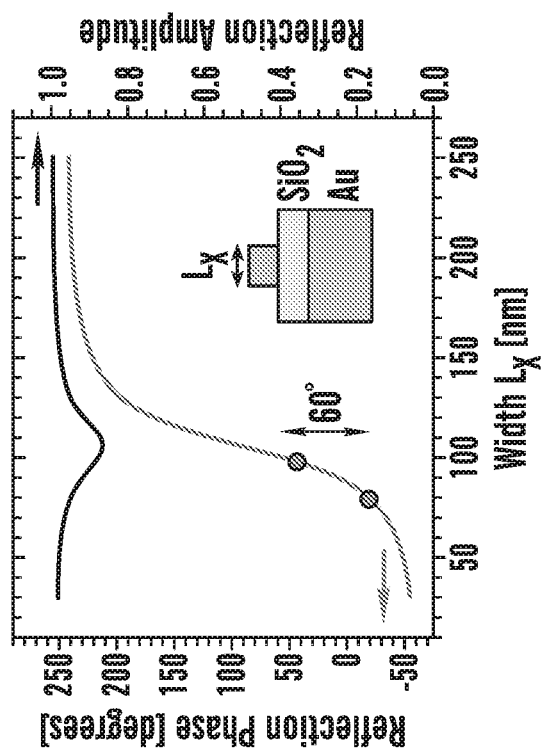
FIG. 5C shows a plot of the calculated reflection phase (red trace) and amplitude (blue trace) of the nanoantenna shown in the inset, computed as a function of the NP width Lx for normally incident x-polarized light. The thickness of the dielectric layer and the NP height are 30 nm. The red circles indicate the two NPs used in each unit cell of the metasurface shown in FIG. 5B.
Figure 5B:
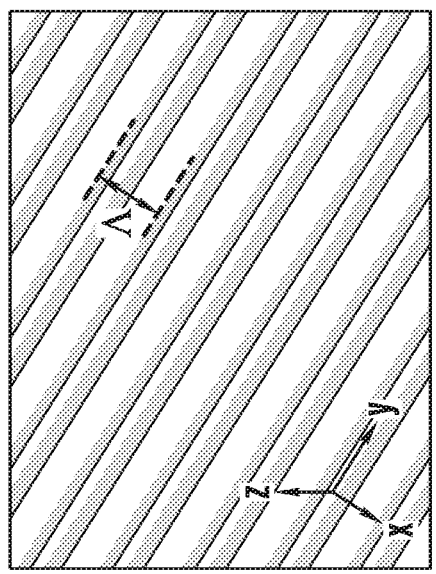
FIG. 5B shows a top view of an imaging device design according to one embodiment of the invention, taken directly from the graphical user interface of the FDTD simulation engine.

FIG. 5B shows an example of a metasurface designed to produce the desired asymmetric response, in accordance with some embodiments of the invention. The NPs used in this example can be regarded as infinitely long in the y direction, whereas their width Lx in the x direction determines their reflection phase for x-polarized incident light. This phase is plotted as a function of Lx in FIG. 5C, as computed with a commercial FDTD simulation tool [55]. As shown by these data, by varying the NP width a large fraction of the entire $2\pi$ phase space can be covered [34, 38], while the reflection amplitude remains high (>86%) for all NP widths considered. The separation and dimensions of the NPs in FIG. 5B were selected using a general design procedure based on well-established arguments from x-ray crystallography [56]. Specifically, for a 1D periodic array of subwavelength NPs, the amplitude of the diffracted wave of order q is proportional to the structure factor $$S_q = \Sigma_m \exp[i(\varphi_m - g_q x_m)],$$

Where the index m runs over all the NPs in one unit cell (e.g., a single pixel), $x_m$ and $\varphi_m$ are the position and reflection phase of the $m^{th}$ NP, respectively, and $g_q = 2q\pi/\Lambda$. First-order diffraction in the forward x direction (i.e., the q=+1 order) can then be suppressed relative to backward diffraction (q=−1) by selecting the design parameters $x_m$ and $\varphi$m so that S+1=0 and S−1≠0. These conditions can be satisfied most simply by using two NPs per unit cell with $x_2 - x_1 = \Lambda/3$ and $\varphi_2 - \varphi_1 = -\pi/3$. The red circles 502 in FIG. 5C indicate two NP widths that produce this desired phase difference. The same NPs, separated by a distance of $\Lambda/3$, are used in the metasurface design shown in FIG. 5B.

In accordance with some embodiments of the invention, using the metasurface shown in FIG. 5B, light incident at the angle $-\theta_{max}$, the SPPs is diffracted in the +x direction by the two NPs in each unit cell that are out of phase, and therefore cancel each other by destructive interference. And for light incident at $+\theta_{max}$, the SPPs scattered in the −x direction by the two NPs interfere constructively. In accordance with the invention, a substantial asymmetry in the direction of the SPPs can therefore be obtained in the angular response, only limited by the finite size of the NPs. It should also be noted that in the same structure the 0 order of diffraction (specular reflection) remains allowed (i.e., S0≠0), unlike the linearly graded metasurfaces described above. This property is useful because otherwise light incident at grazing angles $>\theta_{max}$ would have no other option but to be diffracted into surface waves propagating on the plane of the array [34]. Similar to SPPs, such surface waves can be scattered by the slits through the Au film into the absorbing Si substrate, thereby producing a photocurrent that would degrade the device angular selectivity.

In accordance with some embodiments of the invention, the metasurface can include a set of sub-wavelength slits (parallel to the rectangular NPs) perforated through the Au film and surrounding SiO2 layers every several periods of the array. The purpose of these nano-apertures is to scatter the SPPs excited by the incident light on the top metal surface into radiation propagating preferentially through the Si substrate. The ability of subwavelength slits to efficiently couple SPPs to radiation is clearly demonstrated by several experimental reports of the reverse process, i.e., the excitation of SPPs on the top surface of a perforated metal film via illumination of the slits from the bottom side [30-32]. A more directly related functionality is reported in ref. 57, where a holographic plasmonic grating is used to selectively couple normally incident light with orbital angular momentum into SPPs, which are then transmitted across the metal film through a subwavelength hole array.

Figure 6:
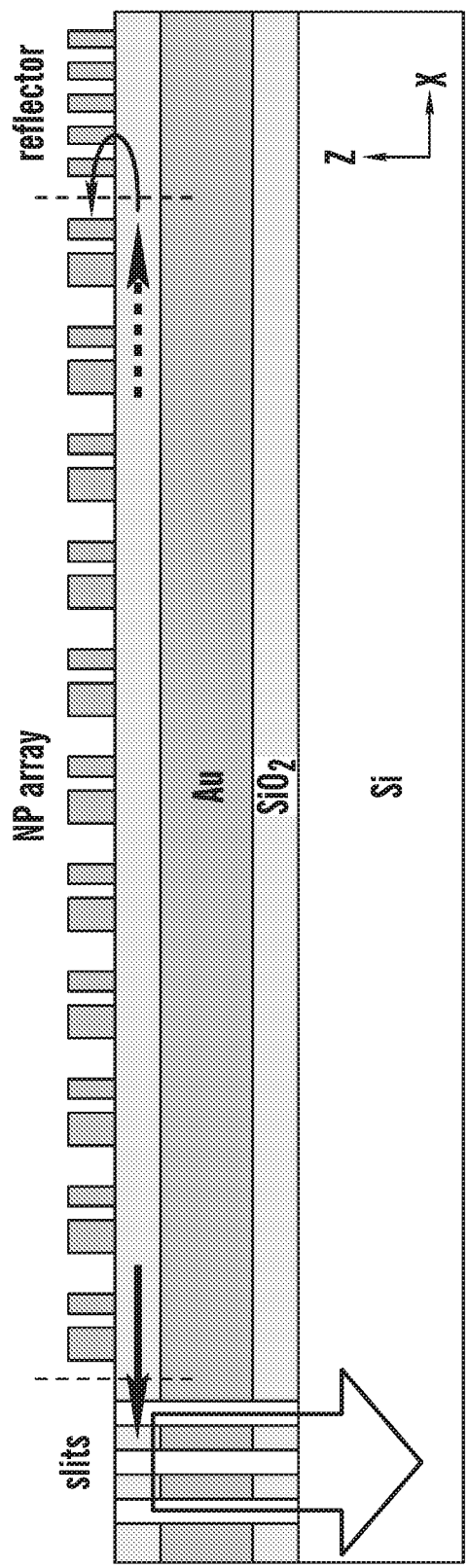
FIG. 6 shows a schematic cross-sectional view of a repeat unit of a directional photodetector, where asymmetry in the angular response is introduced through a combination of nano-slits and a grating reflector surrounding the NP array.

The use of slits also suggests an alternative approach to introduce (or enhance) asymmetry in the device angular response. In the NP arrays under study, incident light at the angles $+\theta_{max}$ and $-\theta_{max}$ can excite SPPs propagating along the −x and +x directions, respectively, see FIG. 5A. Asymmetry can then be introduced by surrounding several periods of the NP grating array with a set of slits on one side (in the −x direction) and a grating reflector on the other side (in the +x direction), as shown in FIG. 6. The reflector can include a simple grating of Au ridges with period $\Lambda_{refl} = \lambda_{SPP}/2$, (i.e., grating vector=$2k_{SPP}$), which converts incident SPPs propagating in the +x direction into reflected SPPs propagating in the −x direction, and vice versa. Therefore, in FIG. 6 the SPPs excited by incident light at $+\theta_{max}$ propagate towards the slits, where they are preferentially scattered into the substrate. In accordance with some embodiments of the invention, the reflector can be a gradient metasurface designed to reflect couple any SPPs incident on the reflect in a predefined direction. In some embodiments, the reflector can reflect any SPPs away from the metasurface. In some embodiments, the reflector can reflect any SPPs back along (e.g., parallel to) the metasurface. In some embodiments, the reflector can reflect any SPPs into the semiconductor substrate (e.g., through openings in the metal film layer).

The SPPs excited by incident light at $-\theta_{max}$ initially propagate towards the grating reflector, where they are reflected back in the opposite direction. Compared to the former SPPs, the latter SPPs on average travel twice the distance before reaching the slits, and in the process experience larger attenuation due to absorption and diffraction. The end result is additional asymmetry in the angular response. In accordance with some embodiments of the invention, each full pixel can include the metasurface shown in FIG. 6, with the length (e.g., in the y dimension) of each NP-array (grating) section determined by the tradeoff between peak transmission and asymmetry.

Several metasurface designs according to the invention were investigated via FDTD simulations. These calculations are based on experimental data for the dielectric function of Au (tabulated in the FDTD software [55]), and thus can provide an accurate model for the plasmonic absorption losses. In fact, a recent study has shown that by optimizing the deposition conditions (even for simple techniques like electron-beam or thermal evaporation) metal films that outperform these absorption estimates can be obtained [58].

Figure 7A:
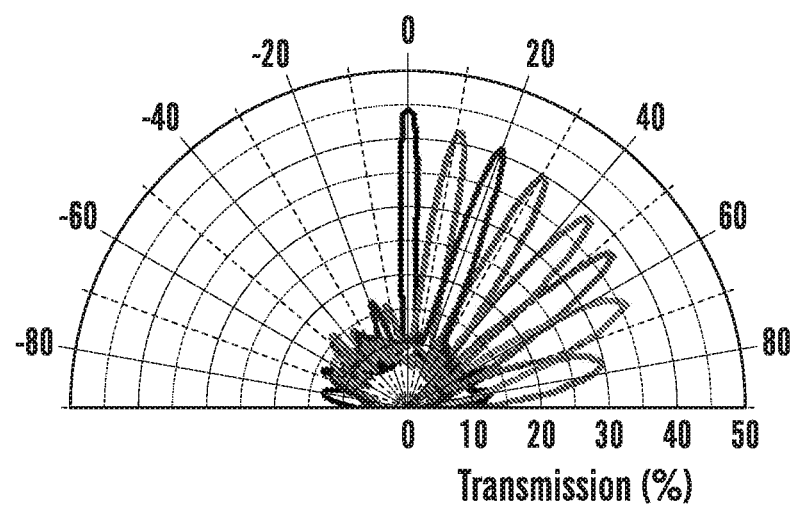
FIGS. 7A-7B show the calculated angular responsivity patterns of directional image sensors based on the device structure shown in FIGS. 5 and 6.

The best simulation results were obtained with a combination of both approaches described above, i.e., using asymmetric NP arrays built in accordance with some of the embodiments of the invention, positioned between the slits and grating reflectors as shown in FIG. 6. FIG. 7A shows the calculated power transmission coefficient for a p-polarized incident plane wave through several such metasurfaces of different periods, as a function of the polar angle of incidence θ on the x-z plane. In all devices, the Au film is 100-nm thick, both SiO2 layers are 30-nm thick, and the Au NP height is 30 nm. The slit section contains three 150-nm-wide slits, and the reflector consists of five repeat units with 270-nm period and 50-% duty cycle. The NP-array section is approximately 6-µm long and its period ranges from 760 to 350 nm for increasing $\theta_{max}$. For s-polarized light, the transmission through the same devices is found to be significantly smaller, on the order of 1% at all angles (the implications for polarization imaging are discussed herein). If the metasurfaces are fabricated on a photodetector active material, the detected signal is proportional to the transmission coefficient of FIG. 7A. Such devices can therefore provide tunable directional photodetection, with a wide tuning range for the angle of peak transmission $\theta_{max}$ of ±75° and relatively narrow angular resolution, ranging from 6° to 18° full-width-at-half-maximum as $\theta_{max}$ is increased. The peak transmission is in the range of 30-45% for all designs considered. These performance metrics are adequate for high-quality image reconstruction. It should also be noted that these devices involve a large number of geometrical design parameters, which collectively offer wide margins for the tradeoff among the relevant figures of merit (i.e., tuning range, angular resolution, peak transmission, asymmetry).

The far-field radiation pattern produced across the metasurfaces shown in FIG. 7A is produced by a dipole source located in the Si substrate. By reciprocity [24], these patterns can be expected to provide an accurate description of the angle-resolved transmission through the same metasurfaces. Representative results are shown in FIG. 7B, where $k_x$ and $k_y$ indicate the x and y components of the incident wavevector, related to the azimuthal and polar angles of incidence as $\phi=\arctan(k_x/k_y)$ and $\theta=\arcsin(\sqrt{k_x^2+k_x^2}/k_0)$, respectively.

The line cut of this color map along the $k_x$ axis is in good agreement with the corresponding trace of FIG. 7A (the red trace 702), which confirms the validity of the reciprocity principle in this context. To help interpret these data, the solid red circle 704 of radius $k_{SPP}$ indicates the available SPP modes on the top metal surface; the dashed curved line 706 highlights the incident directions of peak transmission; the horizontal grey arrows 708 (having length $2\pi/\Lambda$) illustrate how light incident along these directions can excite SPPs by first-order diffraction; and the red arrows 710 show the directions of propagation of the excited SPPs.

Figure 7B:
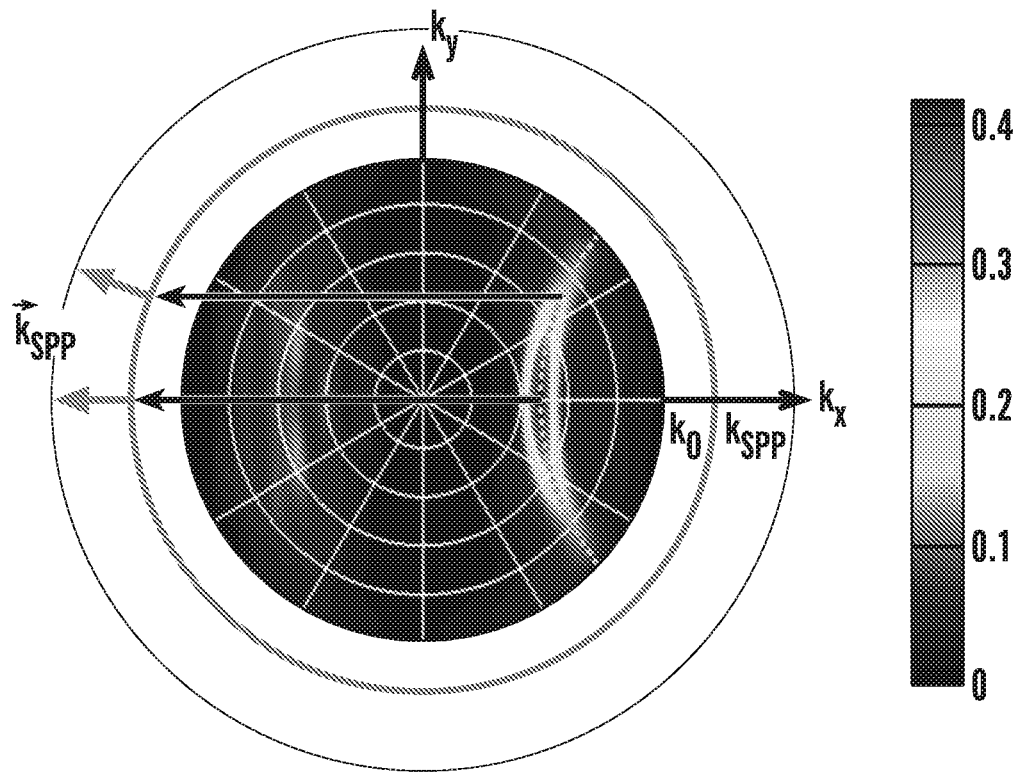

Interestingly, the peak transmission highlighted by the dashed line 706 in FIG. 7B decreases with increasing azimuthal angle φ. This behavior, which improves the overall angular selectivity, can be ascribed to the polarization properties of SPPs. In general, the in-plane component of the electric field of a SPP is parallel to its direction of propagation [23]. In the device geometry under study, incident light at larger and larger azimuthal angle excites SPPs with smaller and smaller x component of the wavevector (and therefore of the electric field), as illustrated by the red arrows 710 shown in FIG. 7B. In the same geometry, where the slits are oriented along the y direction, only the x component of the SPP electric field can be coupled into radiation through the aforementioned excitation of oscillating dipoles across the slits. Thus, the larger φ, the smaller the x-field component of the excited SPPs, and the weaker the scattering into the Si substrate. A similar argument explains why y-polarized incident light is not efficiently transmitted across the same metasurfaces.

Figure 8A:
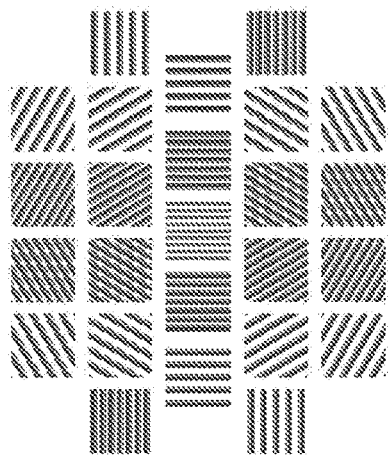
FIG. 8A shows a schematic illustration of the proposed compound-eye cameras according to some embodiments of the invention. Each pixel is coated with an array of symmetric (green lines) or asymmetric (red-green lines) NPs, having different periods and orientations.

The polar angle of peak photodetection $\theta_{max}$ can be controlled by varying the array period Λ according to the diffraction condition $(2\pi \sin \theta_{max})/\lambda_0 - 2\pi/\Lambda = -k_{SPP}$, as illustrated in FIG. 7A. With this approach, there are no fundamental design constraints on the accessible values of $\theta_{max}$, except for the geometric decrease in intercepted optical power with increasing $\theta_{max}$ for fixed device area and incident intensity (given by a factor of $\cos \theta_{max}$). Regarding the minimum achievable tuning step $\delta\theta_{max}$, from the diffraction condition we find that a change in the period δΛ produces a change in the polar angle of peak detection $\delta\theta_{max}=\delta\Lambda/\Lambda(n_{SPP}-\sin \theta_{max})/\cos \theta_{max}$, where $n_{SPP}$ is the SPP effective index (~1.2 in the device of FIGS. 5A and 5B). The smallest achievable control in the period δΛ/Λ depends on the fabrication process, and a value of a few percent is generally realistic. For example, if we assume δΛ/Λ=5%, the equation above gives $\delta\theta_{max}<4°$ for all values of $\theta_{max}<80°$. For fixed period, the azimuthal angle of peak photodetection $\phi_{max}$ can be varied by simply rotating the entire metasurface about its surface normal (the z direction). FIG. 8A shows a schematic diagram of an array of several image sensors, each providing photodetection peaked at a different direction in accordance with some embodiments of the present invention. The minimum achievable tuning step $\Delta\phi_{max}$ again depends on the fabrication process, and small values of a few degrees can be expected across the entire 360° range.

In accordance with some embodiments of the invention, metasurfaces can also be designed to provide multiple peaks in the responsivity pattern, centered at different values of θ and φ. For example, this functionality can be achieved with the basic geometry of FIGS. 5 and 6 by using longer periods Λ and more than two NPs per unit cell, to enable the excitation of backward traveling SPPs through the q=−2 order of diffraction while at the same time suppressing the q=+2 order. Alternatively, we could employ a 2D NP array with asymmetric unit cells (and asymmetrically placed slits and reflectors) in the y as well as x direction, to enable asymmetric diffraction along both directions. In accordance with some embodiments of the invention, the use of multiple responsivity peaks can be used to provide additional design degrees of freedom that may be exploited for a more efficient coverage of the field of view through advanced image reconstruction algorithms.

The angle-resolved responsivity of the image sensing devices according to the invention is intrinsically wavelength dependent, due to its diffractive nature. In accordance with some embodiments of the invention, the image sensing devices can be integrated with a bandpass spectral filter, similar to the pixels used in color cameras. For example, the image sensing devices can be used for color imaging, if designed for operation at different wavelengths and combined with a color filter array. In any case, it should be noted that relatively large filter bandwidths can be used to allow for high photon throughput at each pixel, without any significant performance degradation. In particular, if the incident light has a finite bandwidth Δλ, the main effect on the device angular response is a proportional broadening $\Delta\theta_{max}$ of the transmission peaks. Using the diffraction condition, we find $\Delta\theta_{max}=\Delta\lambda/\lambda_0(n_{SPP}-\sin \theta_{max})/\cos \theta_{max}$, where $\lambda_0$ is the center wavelength of the incident spectrum. Thus, for example, if we use a color filter with a broad bandwidth Δλ/λ₀=40%, the resulting broadening $\Delta\theta_{max}$ is limited to less than 30° for all values of $\theta_{max}<80°$. Such broadening can be accounted for through signal processing upon image reconstruction without any significant loss in resolution.

The metasurfaces of the imaging sensors shown in FIGS. 5A-6 are intrinsically polarization dependent, because only the linear polarization component parallel to the x-z plane is efficiently transmitted. However, in the camera architecture shown in FIG. 8A different pixels detect light polarized along different directions due to the different orientations of their metasurfaces. A similar situation is encountered with the dual-grating pixels used in the planar-Fourier-capture-array camera disclosed in S. Jayasuriya, S. Sivaramakrishnan, E. Chuang, D. Guruaribam, A. Wang, and A. Molnar, "Dual light field and polarization imaging using CMOS diffractive image sensors," *Opt. Lett.* 40, 2433 (2015) [59]. Although only partial polarization information is available at each pixel, this "polarization-angular-diversity" can be systematically exploited to reconstruct polarized images at high spatial resolution using the computational imaging approach, as discussed herein.

Figure 8B:
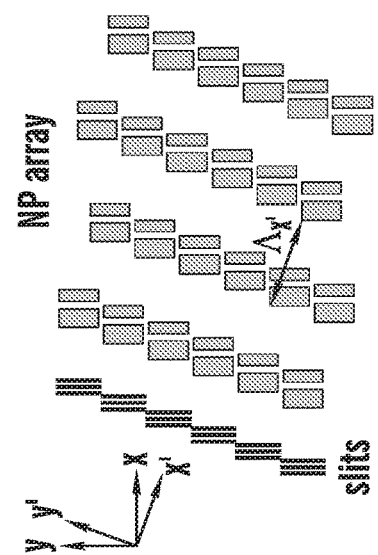
FIG. 8B shows a schematic top view of an angle-sensitive metasurface designed to preferentially detect light with linear polarization along the x direction.
Figure 8C:
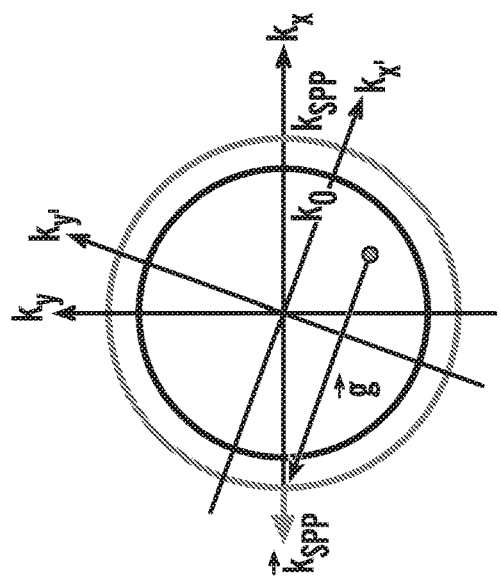
FIG. 8C shows an illustration of the diffraction process for light incident along the direction of peak detection (indicated by the red dot). Using predefined NP periods, the incident light is only scattered via first-order diffraction along the x' direction into an SPP propagating along the x direction, as indicated by the grey arrow.

An alternative metasurface design that is more directly suited to polarization imaging involves rotating the slits and NPs relative to the grating vector g, as shown in FIG. 8B. In this embodiment, diffraction occurs along the x' direction with $g=-\hat{x}' 2\pi/\Lambda_{x'}$, whereas the slits and NPs are oriented perpendicular to the x direction (by design, the period in the y' direction is small enough that it does not produce any diffraction). Peak transmission is then obtained for the incident wavevector indicated by the red dot 802 in FIG. 8C, since the SPPs excited by this wave propagate in the direction perpendicular to the slits and therefore are optimally scattered into the substrate. Since the in-plane electric field of these SPPs is along the x direction, they cannot be excited by diffraction of incident light polarized along the y direction. As a result, selective detection of x-polarized light is produced. In accordance with some embodiments of the invention, two different pixels can be developed to separately detect the same x and y orthogonal polarizations for any given incident direction, thereby enabling fully polarized imaging and vision.

Figures 9A, 9B:
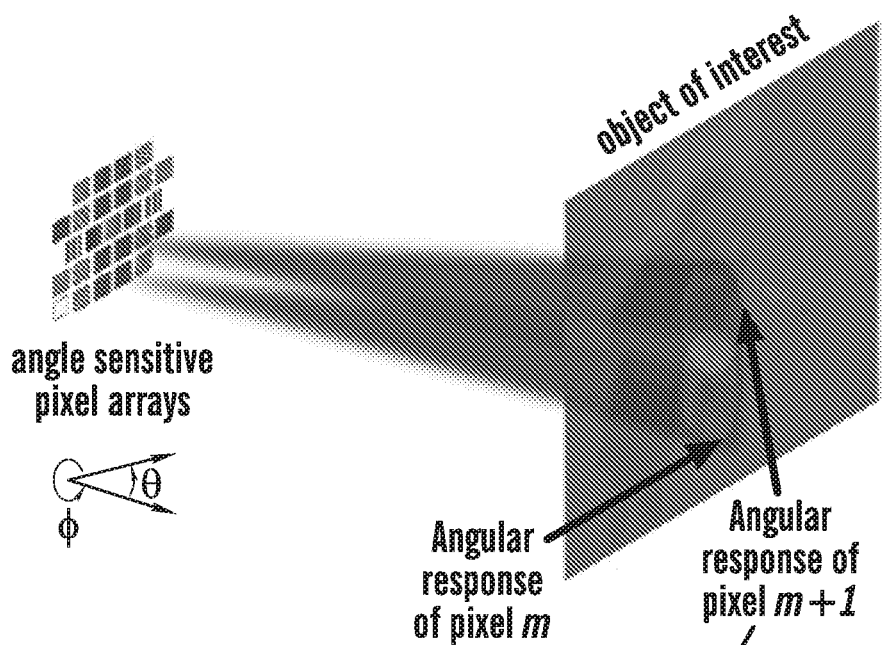
FIGS. 9A-9D show data acquisition and image reconstruction for wide FOV imaging according to some embodiments of the invention.

One advantage of the present invention is that the compound-eye cameras based on the proposed angle-sensitive pixels can be configured to provide a wide field-of-view (FOV) imaging capability. Using the pixel arrangement illustrated in FIG. 8A, a series of preliminary numerical simulations were conducted. A schematic diagram of the imaging geometry used in these simulations is shown in FIG. 9A. In these simulated, objects far away from the pixel array are considered, so that each angle corresponds uniquely to a different spatial point on the object. The total angular FOV of the simulated array is ±75°. Each pixel integrates the total intensity detected according to its angular response. The image-formation process can then be described by a linear equation, which relates the object intensity distribution (x) to the captured data (y) by a measurement matrix (A) shown in FIG. 9B. The angular response of each pixel forms a row vector of A, which describes the intensity contributions to each pixel from different points on the object.

Figure 9C:
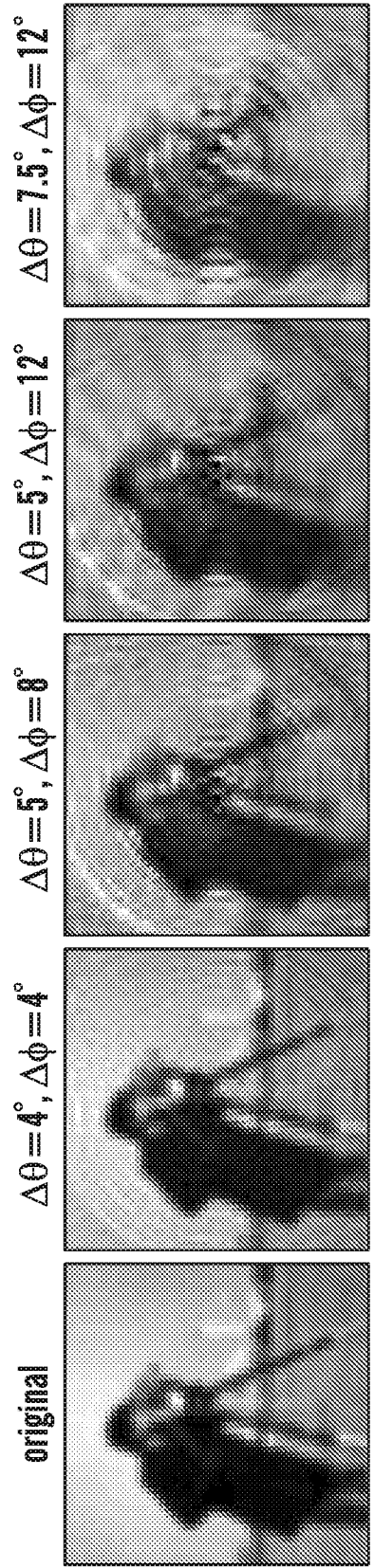

Using the calculated angular responsivity functions of FIG. 7A (and their interpolations for additional metasurface designs), one can validate the ability of the cameras according to some embodiments of the invention to resolve complex objects. This is demonstrated in FIG. 9C, where we show that a high-resolution reconstructed image (nearly identical to the original object in this example) can be obtained using a relatively small but fully realistic spacing of 4° in both polar (θ) and azimuthal (φ) angles. The corresponding number of pixels needed to cover the full FOV is less than 1800. Although the quality of the reconstruction degrades as we increase the angular spacing, even at the largest spacing considered in this figure a recognizable image is still obtained.

Figure 9D:
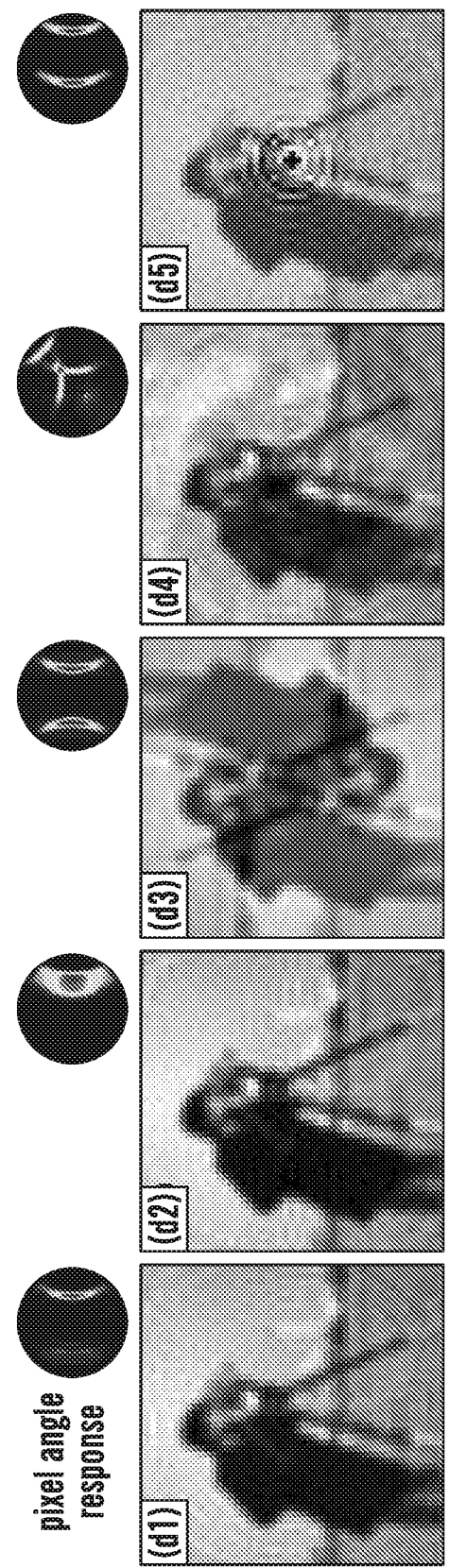

The simulation results of FIG. 9D show the relationship between angle responsivity design and imaging performance. To compare different designs, the polar and azimuthal angle spacing were both fixed at 4°. Using the narrow angular response based on monochromatic illumination as shown in FIG. 7A, a high resolution reconstruction can be achieved as shown in FIG. 9D, image (d1). Using broadband illumination with $\Delta\lambda/\lambda_0=40\%$ broadens the angular response, but does not blur the reconstruction by any significant amount as shown in FIG. 9D, image (d2). The importance of unidirectional response enabled by our metasurface design is also highlighted—normal gratings with symmetric response result in "twin-image" artifacts as shown in FIG. 9D, image (d3). Finally, the feasibility of imaging with angular multiplexing, using metasurfaces that allow for multiple sets of angles to be sensed simultaneously through different orders of diffraction is shown in FIGS. 9D, images (d4) and 9(d5). The angle multiplexing and demultiplexing method considered here is analogous to the coded aperture techniques [60, 61], with the advantage of being applied directly at the sensor level. In general, this approach can improve light efficiency, at the expense of putting more burden on the computation. In the examples shown in FIGS. 9D, images (d4) and 9(d5), it also results in degraded reconstruction—however a suitable combination of all the different designs considered in FIG. 9A can be used to provide optimal coverage of the FOV for fixed resolution.

The simulations of FIGS. 9A-9D assume perfect knowledge about the angular response of each pixel. In practice, any difference between the expected and the actual pixel responses will degrade the reconstruction result. Calibration procedures can be used to minimize this model mismatch. In addition, algorithmic "self-calibration" methods can be used to reduce the errors from model mismatch by judiciously parameterizing the systems and minimizing a cost function [62].

In accordance with some embodiments of the invention, a theoretical photon-budget analysis for the proposed angle-sensitive pixels, can be based on the following formula:

$$P = \left(\frac{1}{2}\right) \int \int_{\Delta\Omega} \int_{\Delta\Omega} i_o(\Omega, \lambda_-) \cdot \eta(\lambda) \cdot \Delta^2 \cdot \tau(\Omega, \lambda) d\Omega \, d\lambda$$

where P is the total optical power detected by each pixel, $i_o(\Omega, \lambda)$ is the spectral radiance from the object, $\Delta\Omega$ denotes the angular FOV of each pixel, $\Delta$ the pixel size, $\Delta\lambda$ the spectral bandwidth, $\tau(\theta, \phi, \lambda)$, is the metasurface transmission coefficient obtained (or interpolated) from FIG. 7, and $\eta(\lambda)$ is the photodetector quantum efficiency. A similar scaling was found in alternative compound camera architectures [3, 5, 52].

For a 10-μm-sized pixel, having the broadband angle response of FIG. 9(d2) at a center wavelength of 800 nm with an average quantum efficiency of 40%, we estimate the total number of photons received using a 1.0 ms exposure time from scenes in an average clear day to be on the order of several 105 photons. The corresponding photon-limited signal-to-noise ratio is above 300. These considerations suggest that the proposed cameras can provide the required sensitivity for a wide range of relevant applications.

Figure 10A:
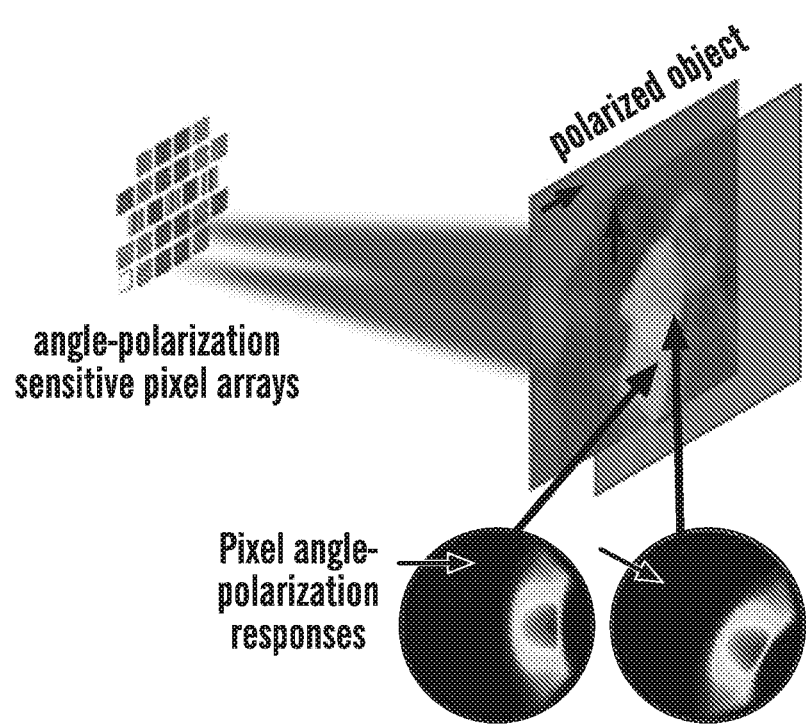
FIG. 10A shows that each angle-polarization sensitive pixel integrates the light intensity from both polarizations from a cone of angles.

In accordance with some embodiments of the invention, the imaging sensors can be used for polarization sensitive imaging. Preliminary numerical studies were conducted using the image sensing devices according to some embodiments of the invention shown in FIGS. 5A-6 in the arrangement of FIG. 8A. In these simulations, each angular sensitive cone contains both x and y polarized light from two complementary images as shown in FIG. 10A. Each pixel then integrates the light intensity from both polarizations, but by different amounts because of its intrinsic polarization sensitivity. Due to the overlapping coverage between neighboring pixels, each object point is sensed by multiple pixels that have different polarization responses. This "polarization-diversity" measurement architecture allows for the computational recovery of the polarized images shown in FIG. 10B. It should be noted that in this case the angular broadening from broadband illumination is actually beneficial, since the polarization recovery benefits from overlapped pixel responses. This is illustrated in FIG. 10B, where it is shown that the quality of the reconstructed polarized images improves as the illumination bandwidth increases.

Figure 10B:
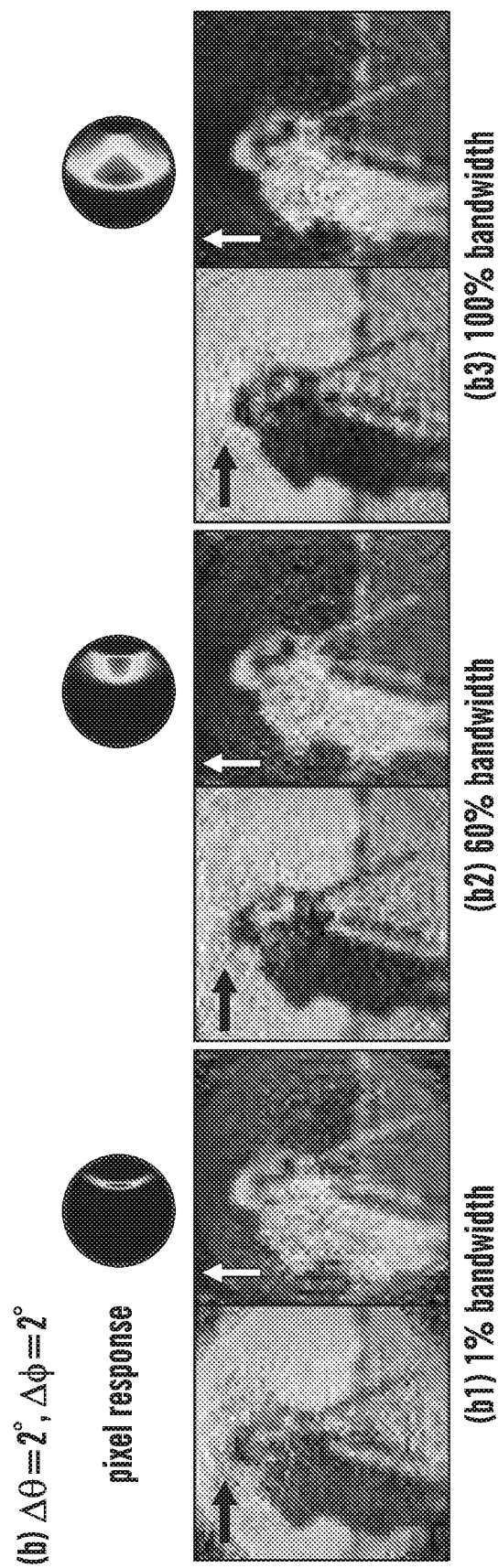
FIG. 10B shows a simulated reconstruction of polarization images using pixel arrays with different spectral bandwidth.

At the same time, with the approach just described, full recovery of high-quality polarized images can be achieved using smaller steps in $\theta$ and $\phi$ (e.g., 2° as shown in FIG. 10B), compared to the non-polarized case. This limitation can be overcome using, for example, the metasurface design shown in FIG. 8B, where the angles and polarizations of peak detection are fully decoupled, so that a complete set of pixels covering the entire FOV can be designed for each polarization.

In accordance with some embodiments of the invention, the proposed directional image sensors can employ simple Si photoconductors, each consisting of two metal contacts deposited on the top surface of a Si wafer separated by a distance of about 10 µm. The metasurfaces can be fabricated in the space between each pair of electrodes, using available tools. For example, the metal film layer (e.g. Au films) can be deposited by electron-beam evaporation using optimized deposition rates [58]; the NP arrays can be patterned by electron-beam lithography; and the slits can be fabricated using focused ion beam (FIB) milling or Electron-beam lithography. More scalable fabrication processes such as interference lithography can also be used for the same devices. High pixel-density compound-eye imaging sensors (and cameras) can be fabricated by applying this flow to the fabrication of the metasurfaces directly on a commercial array of CMOS or CCD photodetectors.

Individual devices can be characterized by angle-resolved photocurrent measurements, for example, under illumination with filtered and collimated light from a lamp. For these measurements, the samples can be mounted on piezo-controlled rotational stages that allow varying both azimuthal and polar angles of incidence. The measured responsivity patterns can be compared with simulation results shown in FIGS. 7A and 7B, and used to optimize the imaging sensor device design and fabrication.

Figure 11B:
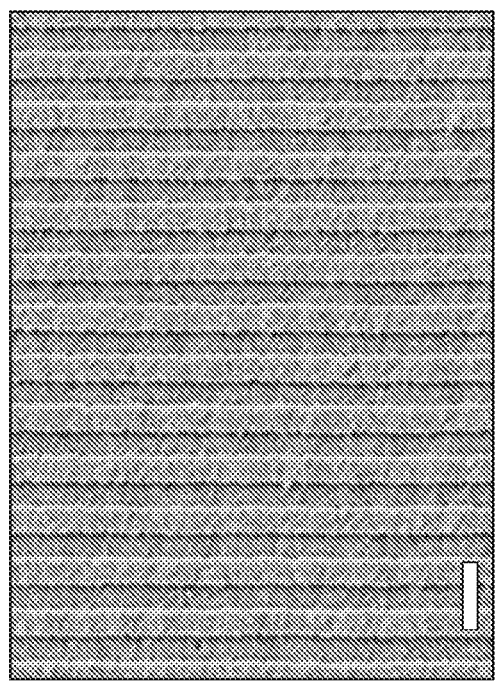
FIG. 11B shows a SEM image of a similar grating. The scale bar is 600 nm.
Figure 11A:
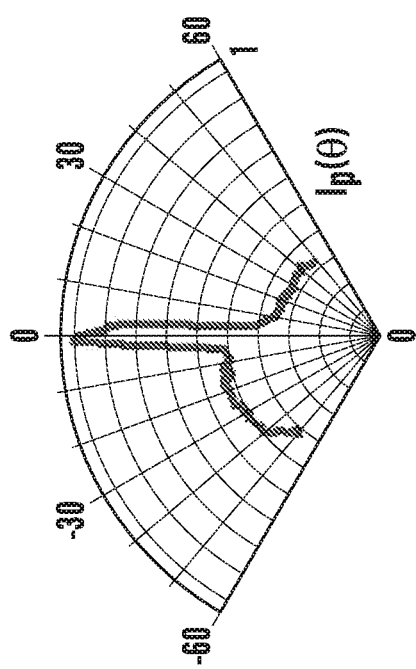
FIG. 11A shows a normalized plot of photo-current versus polar angle of incidence for a device based on a 1D metallic grating of period equal to the SPP wavelength.

An example of responsivity characterization results is shown in FIG. 11A, which provides a plot 1102 of photocurrent versus polar angle on the x-z plane, measured on a device coated with a metal film supporting a 1D symmetric grating shown in FIG. 11B with period tuned to the SPP wavelength. In this preliminary device, no slits are introduced in the metal film, and coupling of the excited SPPs to the absorbing substrate is obtained by using a very small film thickness (40 nm). FIG. 11A shows that the device provides highly directional photodetection along the sample surface normal with a narrow angular resolution of about 8° (full width). The asymmetric shape of the pedestal in these data may be attributed to imperfect alignment and contributions from the edges of the grating.

In accordance with some embodiments of the invention, an array of imaging devices can be optimized to cover the entire range of polar angles $\theta$ (from 0 to 75° in equal intervals $\Delta\theta$) for the same azimuthal angle $\phi=0°$. The arrays can include up to 20 or more different pixels, and can provide a small angular step $\Delta\theta$ of 4°. To cover the full FOV, the array can be mounted on a piezo-controlled rotational stage and rotated around a full circle in equal steps $\Delta\phi$. With this arrangement, data can be collected from both illuminated transparencies and various real objects.

In accordance with some embodiments of the invention, image reconstruction algorithms can be developed based on the responsivity patterns of individual devices and can be used in the reconstruction of complex images from these experimental data, similar to the simulation results of FIGS. 9 and 10. The imaging capabilities of the proposed cameras can be investigated in detail, e.g., by using objects with different geometries and under different lighting conditions, and by varying the angular resolution ($\Delta\phi$ can be varied by changing the rotation angle of the piezo-controlled stage; $\Delta\theta$ can be increased in integral steps by only using the data from a subset of pixels in the array) and, polarization imaging can be demonstrated by simultaneously illuminating the array with orthogonally polarized light from two different objects.

Figure 12:
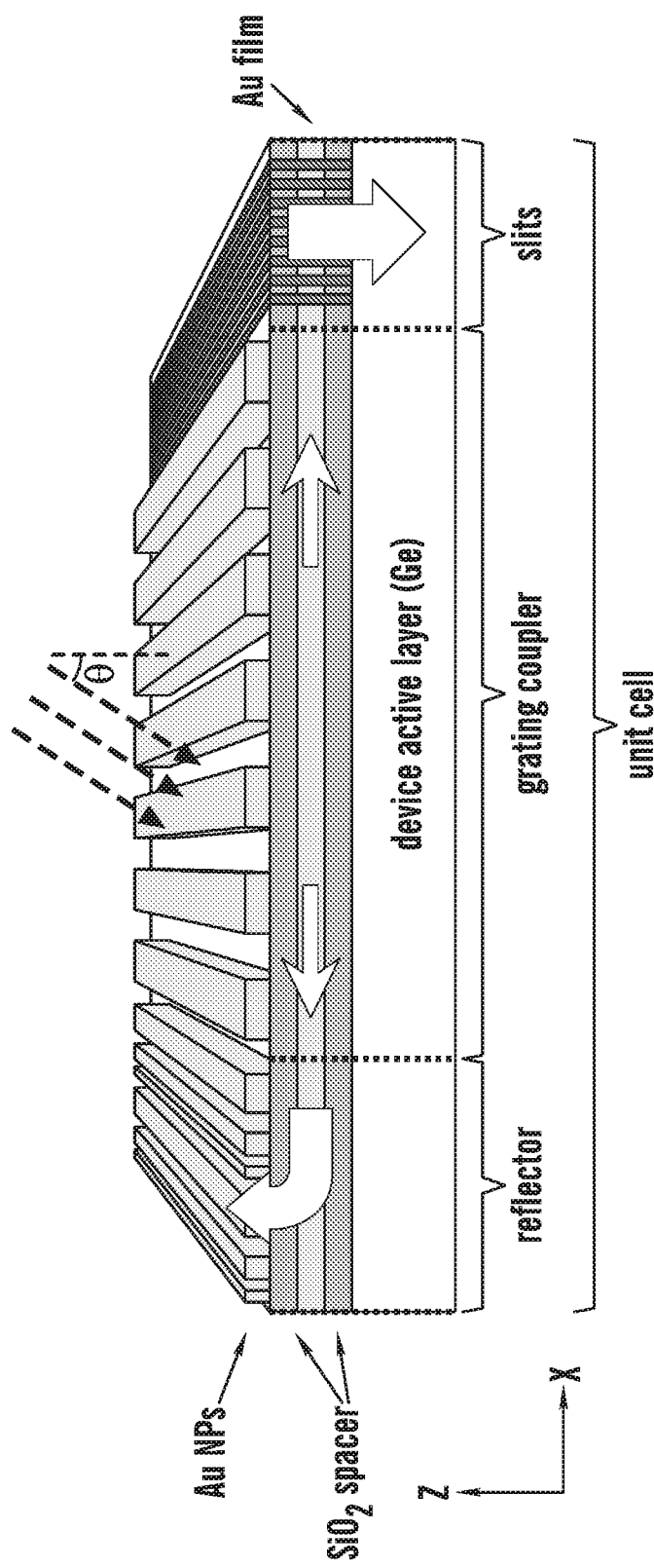
FIG. 12 shows a schematic illustration of a proposed device geometry for an imaging sensor according to some embodiments of the invention.

The principle of operation of the proposed imaging sensor devices according to some embodiments of the invention is illustrated schematically in FIG. 12. The substrate 510 including that device active material (e.g., a Ge photoconductor) can be coated with a metal film (e.g., a silver film layer) 512 and a metasurface 513 including a periodic array of metallic nanoparticles (NPs) 518 can be formed on the top surface of the metal film 512. A thin dielectric layer (e.g., Silicon Dioxide) 514 can separate the metal film layer 512 from the substrate 510 and a thin dielectric layer (e.g., Silicon Dioxide) 516 can separate the metal film layer 512 from the metasurface 513. Photodetection can be achieved through an indirect process where the incident light is first diffracted by the NP array 518 of the metasurface 513 into surface plasmon polaritons (SPPs) 532 and 534 propagating on the top surface of the metal film. A small number of subwavelength slits 542 in the metal film 512 can be used to scatter these SPPs 532 into radiation 536 propagating predominantly into the absorbing active layer of the substrate 510, and as a result a photocurrent signal is produced.

Specifically, SPPs 532 and 534 propagating along the ±x direction can be excited via first-order diffraction of light 522 incident (on the x-z plane) at the equal and opposite angles $\pm\theta_{max}$ determined by the diffraction condition ($2\pi \sin \theta_{max})\lambda_0 - 2\pi/\Lambda = -2\pi/\lambda_{SPP}$, where $\lambda_0$ and $\lambda_{SPP}$ are the wavelengths of the incident light 522 and excited SPPs 532, 534, respectively, and $\Lambda$ is the array period. Light incident at any other angle is instead completely reflected (or diffracted) away from the surface 513. The selective detection of light 522 propagating only along one incident direction (either $+\theta_{max}$ or $-\theta_{max}$) is then obtained by surrounding the NP array 518 with a set of slits 542 on one side (e.g., in the +x direction) and a grating reflector 550 on the other side (in the −x direction). The grating reflector 550 can include a separate and distinct grating of rectangular NPs 552 (e.g., a gradient metasurface) designed to scatter incident SPPs 534 propagating in the −x direction into light 538 radiating away from the substrate 510 along the surface normal direction. Therefore, the SPPs 532 excited by incident light 522 at $+\theta_{max}$ propagate towards the slits 542, where they are scattered into the substrate 510. The SPPs 534 excited by incident light at $-\theta_{max}$ propagate towards the grating reflector 550, where they are scattered back into free space.

Figure 13A:
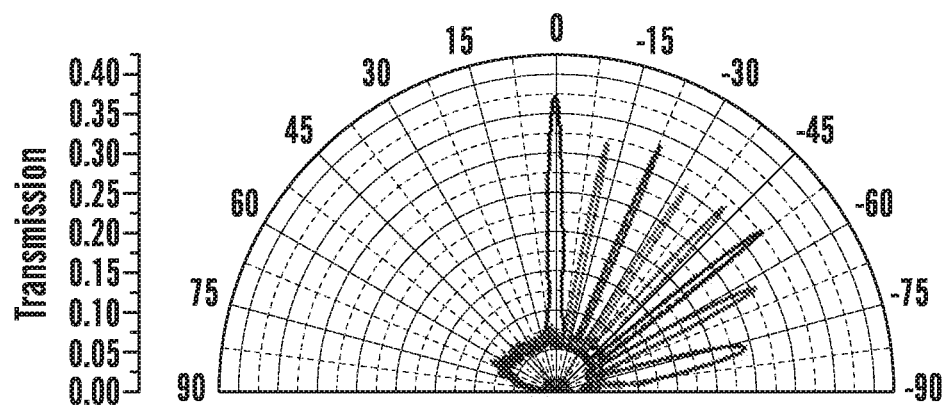
FIGS. 13A and 13B show the calculated angular responsivity patterns of directional image sensors based on the device structure of FIG. 12.
Figure 13B:
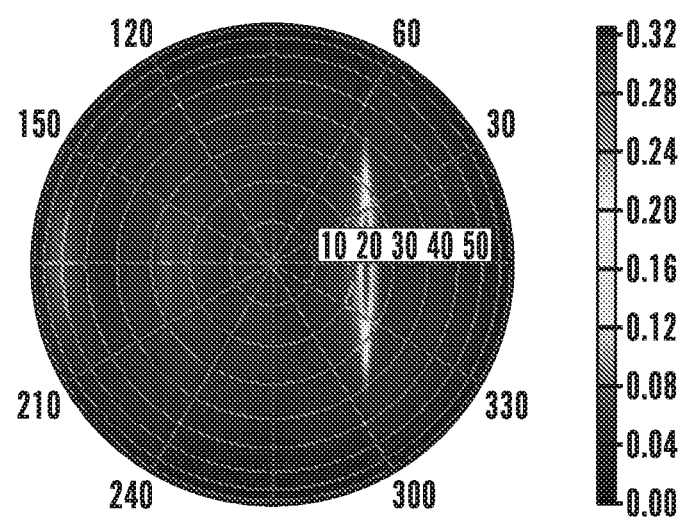

FIGS. 13A and 13B show FDTD simulations for an imaging device structure based on the geometry of FIG. 12, for different values of the target detection angle $\theta_{max}$ at 1.55-µm wavelength. The results shown in FIG. 13A include a plot of the calculated p-polarized power transmission coefficient into the absorbing substrate as a function of the polar angle of incidence θ (on the x-z plane). Each trace corresponds to a different array period Λ. As shown in the figure, these devices can provide tunable directional photo-detection with a wide tuning range for $\theta_{max}$ of up to over ±75° and relatively narrow angular resolution (<8° full-width-at-half-maximum). The peak transmission is in the range of 25-35% for all devices considered. In each case, the s-polarized transmission value is found to be significantly smaller, by a factor of at least 10×. This intrinsic polarization dependence limits the overall device sensitivity, but at the same time could be used to exploit the distinct advantages of polarization vision such as reduced glare and improved contrast. Finally, to illustrate the full 3D response of the designed metasurfaces, FIG. 13B shows the p-polarized transmission of one imaging device, corresponding to the blue trace 1302 in FIG. 13A, as a function of both polar and azimuthal illumination angles, computed with a reciprocity-based method.

The compound-eye cameras according to some embodiments of the invention can be constructed using one or more arrays of several pixels based on the device structure just described (e.g., FIG. 12), each providing directional photo-detection peaked at a different combination of polar and azimuthal angles ($\theta_{max}$ and $\phi_{max}$, respectively). The value of $\theta_{max}$ can be controlled by controlling the diffraction condition by varying the array period Λ of the nanoparticles, as illustrated in FIGS. 12 and 13A. For a fixed period, $\phi_{max}$ can be varied by simply rotating the entire metasurface about its surface normal.

Figures 14A, 14B:
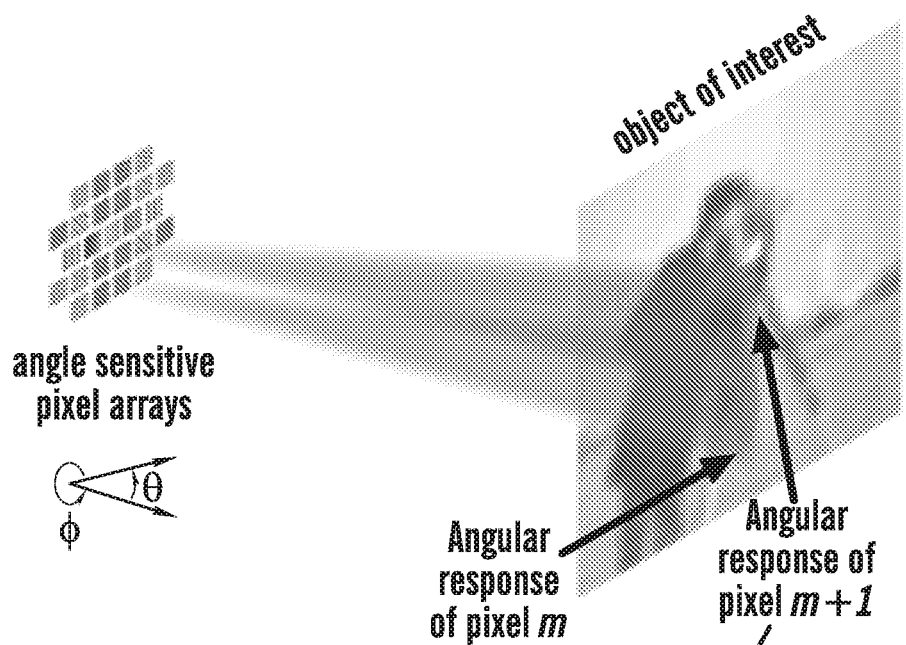

Using this metasurface configuration on each pixel, a series of numerical simulations were conducted to evaluate the resulting imaging capabilities of the system shown in FIG. 14A. In these simulations, each pixel integrates the total intensity detected according to its angular response, given by the calculated patterns of FIG. 13A and their interpolations for additional metasurface designs. The image-formation process is then described by a linear equation, which relates the object intensity distribution (x) to the captured data (y) by a measurement matrix (A) as shown in FIG. 14B.

Representative simulation results for the object of FIG. 14C under monochromatic illumination at $\lambda_0$=1550 nm are shown in FIG. 14D. As illustrated by these plots, a high-quality reconstructed image can be obtained using a relatively small but fully realistic spacing of 4° and 3° in polar and azimuthal angle, respectively shown in the middle panel of FIG. 14D. The corresponding number of pixels for a wide field of view of ±75° is only 2160. Although the image quality degrades as the angular spacing is increased, a recognizable image can still be obtained with a number of pixels as small as less than 900, as shown in right panel of FIG. 14D. Furthermore, the computational imaging method described above also allows for the reconstruction of accurate images under broadband illumination, for example, with bandwidth $\Delta\lambda=0.2*\lambda_0$ as shown in FIG. 14E, despite the resulting broadening in the angular response of each pixel.

In accordance with some embodiments of the invention, the image sensor devices can be based on simple Ge photoconductors, each consisting of two metal contacts deposited on the top surface of a Ge substrate. The metasurface providing the required angular selectivity is then fabricated in the space between the two electrodes, using known tools including photolithography, electron-beam evaporation, sputtering, and electron-beam lithography (EBL). In accordance with some embodiments of the invention, the slits can be fabricated using EBL with a combination of positive and negative resists, followed by dry etching, metal evaporation, and liftoff.

Figure 15A:
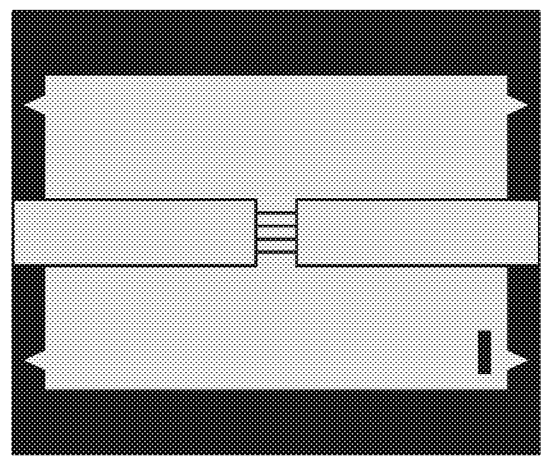
FIGS. 15A-15C show SEM images of a fabricated imaging device having on the geometry shown in FIG. 12. The scale bar is 100 $\mu$m in (a), 5 $\mu$m in (b), and 2 $\mu$m in (c). The images in FIGS. 15A and 15C were taken before fabrication of the grating.
Figure 15B:
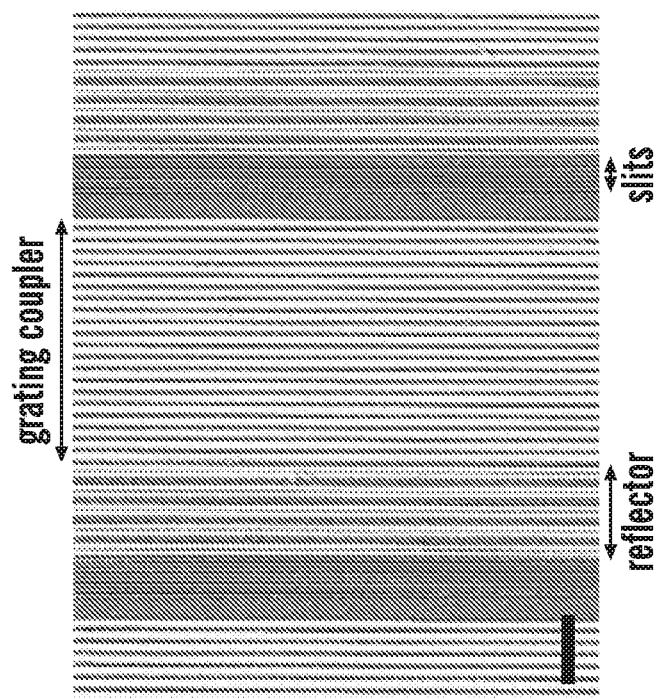
Figure 15C:

FIGS. 15A-15C show SEM images of a representative device based on this fabrication process. The lower-magnification image of FIG. 15A includes the electrodes 1502 AND 1504 used to bias the active region and collect the photocurrent (the top and bottom rectangular shapes) and the Au film 512 in between, all of which were patterned using photolithography, electron-beam evaporation, and liftoff. The slits 542 in the Au film are also visible in this image. FIG. 15B is a higher-magnification image of the complete metasurface 513, showing a full grating-coupler section 518 surrounded by a reflector 550 on one side and a set of slits 542 on the other. The grating fabrication process also involves EBL, electron-beam evaporation, and liftoff. A higher-magnification image of the slits (before grating fabrication) is shown in FIG. 15C.

Figure 16A:
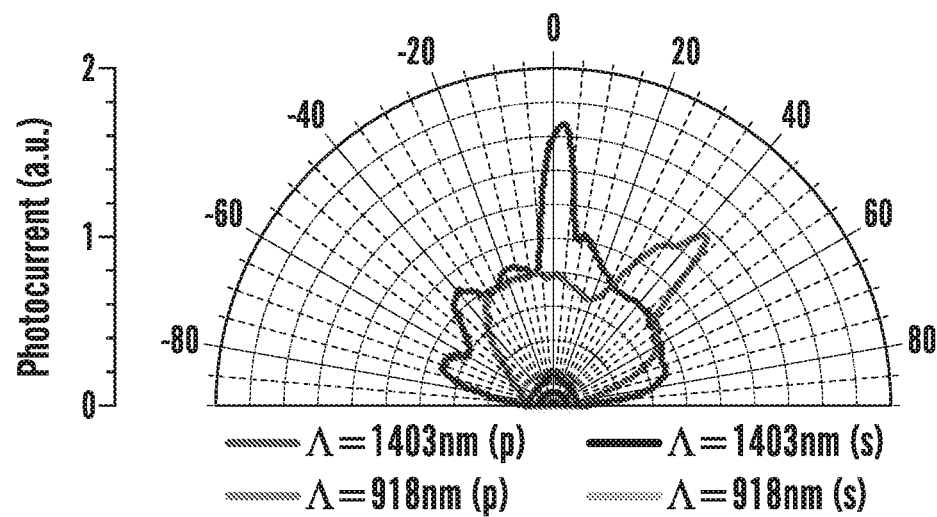
FIGS. 16A and 16B show the measured angular responsivity patterns of the imaging sensor device shown in FIG. 12.
Figure 16B:
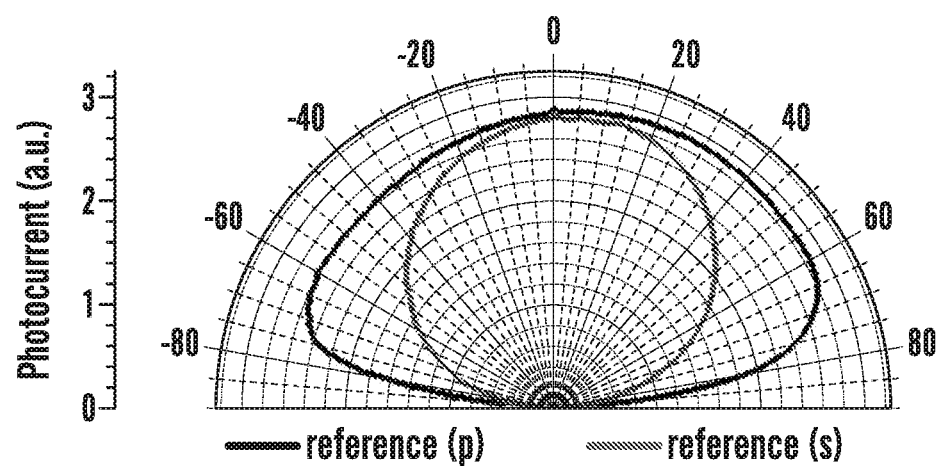

The imaging devices according to the invention can be characterized by angle-resolved photo-current measurements, under illumination with weakly focused laser light. FIG. 16A shows characterization results for two devices with NP array Λ=1403 nm and 918 nm. A highly directional peak 1602 and 1604 is observed in the p-polarized response of both devices, over a relatively uniform background. The incident polar angle of peak photocurrent is about 0° for Λ=1403 nm and about 40° for Λ=918 nm, in good agreement with expectations based on the aforementioned diffraction condition. The peak-to-background ratio of both devices is near 2×, and their spectral selectivity (full width at half maximum of the peak over the background) is 9° and 15°, respectively. The s-polarized photocurrent patterns 1606 and 1608 of both devices, also shown in FIG. 16A, are quite isotropic and much weaker than the p signals, confirming the polarized nature of their response. Finally, comparison with data measured from an otherwise identical device without any metasurface, as shown in FIG. 16B, indicates that the metasurface introduces a transmission penalty at the angle of peak response of 1.7× for Λ=1403 nm and 2.1× for Λ=918 nm.

These measured performance characteristics are already reasonably close to the calculated values described herein. In conjunction with the computational-imaging simulations of FIG. 14A-14E, these results demonstrate the feasibility of practical compound-eye image sensors based on the proposed lensless approach.

Other embodiments are within the scope and spirit of the invention. For example, due to the nature of software, functions described above can be implemented using software, hardware, firmware, hardwiring, or combinations of any of these. Features implementing functions may also be physically located at various positions, including being distributed such that portions of functions are implemented at different physical locations.

Further, while the description above refers to the invention, the description may include more than one invention.

What is claimed is:

1. An imaging sensor comprising:
at least one pixel sensor configured to produce an electrical signal in response to an optical signal received at a first surface of the single pixel sensor;
a metal film layer disposed over at least a portion of the first surface, the metal film including a top surface and a bottom surface;
a first dielectric layer disposed between the first surface and the bottom surface of metal film layer and a second dielectric layer disposed over at least a portion of the top surface of the metal film layer;
a periodic array of nanoparticles disposed on the second dielectric layer, the periodic array of nanoparticle being arranged in a predefined configuration such that light incident on the array of nanoparticles within a predefined range of angles with respect to periodic array of nanoparticles is diffracted by the array of nanoparticles into surface plasmon polaritons that propagate along the top surface of the metal film and become absorbed by the first surface and cause the at least one pixel sensor to produce an electrical signal; and
light incident on the array of nanoparticles that is not within the predefined range of angles is not diffracted into surface plasmon polaritons that propagate along the top surface of the metal film.

2. The imaging sensor according to claim 1 wherein the at least one pixel sensor includes a Germanium photoconductor.

3. The imaging sensor according to claim 1 wherein the metal film layer includes silver or gold.

4. The imaging sensor according to claim 1 wherein the metal film layer has a predefined thickness in the range from 10 nm to 1000 nm.

5. The imaging sensor according to claim 1 wherein the first dielectric layer includes silicon dioxide.

6. The imaging sensor according to claim 1 wherein the first dielectric layer has a predefined thickness in the range from 10 nm to 1000 nm.

7. The imaging sensor according to claim 1 wherein the second dielectric layer includes silicon dioxide.

8. The imaging sensor according to claim 1 wherein the second dielectric layer has a predefined thickness in the range from 10 nm to 1000 nm.

9. The imaging sensor according to claim 1 wherein the array of nanoparticles forms a diffraction grating comprising a unit cell including two or more rectangular nanoparticles separated by a predefined distance in a range from 10 nm to 100 nm.

10. The imaging sensor according to claim 9 wherein the diffraction grating includes at least two unit cells separated by a period, $\Lambda$, in a range from 250 nm to 2000 nm.

11. An imaging sensor comprising:
an array of pixel sensors forming a solid state photo detector material having a first surface configured to receive surface plasmon polaritons; and
a metasurface coupled to the first surface of the solid state photo detector material, the metasurface comprising:
a metal film layer disposed over at least a portion of the first surface, the metal film including a top surface and a bottom surface;
a first dielectric layer disposed between the first surface and the bottom surface of metal film layer and a second dielectric layer disposed over at least a portion of the top surface of the metal film layer; and
an array of nanoparticles arranged on the second dielectric layer forming a grating coupler section and a slits section.

12. The imaging sensor according to claim 11 wherein
the grating coupler section comprises a periodic array of nanoparticles arranged in a predefined configuration such that light incident on the array of nanoparticles within a predefined range of angles with respect to periodic array of nanoparticles is diffracted by the array of nanoparticles into surface plasmon polaritons that propagate along the top surface of the metal film layer; and
wherein the slits section positioned on a first side of the grating coupler section comprising a plurality of slits extending through the second dielectric layer, the metal film layer and the first dielectric layer to the solid state photo detector material such that the surface plasmon polaritons propagating along the top surface of the metal film layer propagate into the solid state photo detector material.

13. The image sensor according to claim 12 wherein the metasurface further includes a reflector section positioned on a side opposite to the first side and the reflector section further includes a grating of nanoparticles configured to reflect the surface plasmon polaritons away from the reflector section.

14. The image sensor according to claim 13 wherein the reflector section reflects the surface plasmon polariton toward the slits section.

15. The image sensor according to claim 13 wherein the reflector section reflects the surface plasmon polariton away from the solid state photo detector material.

* * * * *